(12) United States Patent
Matsuzaki et al.

(10) Patent No.: US 9,998,104 B2
(45) Date of Patent: Jun. 12, 2018

(54) SEMICONDUCTOR DEVICE AND ELECTRONIC DEVICE

(71) Applicant: SEMICONDUCTOR ENERGY LABORATORY CO., LTD., Atsugi-shi, Kanagawa-ken (JP)

(72) Inventors: Takanori Matsuzaki, Kanagawa (JP); Kiyoshi Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 21 days.

(21) Appl. No.: 14/945,499

(22) Filed: Nov. 19, 2015

(65) Prior Publication Data

US 2016/0149567 A1  May 26, 2016

(30) Foreign Application Priority Data

Nov. 21, 2014 (JP) ................... 2014-236427

(51) Int. Cl.
*H03K 5/153* (2006.01)
*H03K 5/24* (2006.01)

(52) U.S. Cl.
CPC ..................... *H03K 5/24* (2013.01)

(58) Field of Classification Search
CPC ........ H03K 5/2481; H03K 5/249; H03K 5/08; H03K 5/24; G01R 19/16519
(Continued)

(56) References Cited

U.S. PATENT DOCUMENTS 5,157,626 A * 10/1992 Watanabe ................ 365/185.2
5,731,856 A    3/1998 Kim et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Quan Tra
(74) *Attorney, Agent, or Firm* — Nixon Peabody LLP; Jeffrey L. Costellia

(57) ABSTRACT

In a configuration including a first circuit for retaining a plurality of analog voltages and a second circuit capable of reading one of the analog voltages as a digital signal, correct data can be read even when characteristics of transistors in the first and second circuits vary with the temperature change. A reference voltage is applied to a gate of a transistor in the second circuit whose threshold voltage varies with the temperature change, and a corrected reference voltage is generated by adding a threshold voltage variation of the transistor in the second circuit to the reference voltage. An analog voltage is read out as a digital signal with the use of the corrected reference voltage, resulting in readout of correct data obtained by canceling out variations in characteristics due to the temperature change of the transistor in the first circuit.

18 Claims, 21 Drawing Sheets

(58) Field of Classification Search
USPC .......................................................... 327/77
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,372,737 | B2 * | 5/2008 | Kato .......................... 365/185.2 |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 9,171,630 | B2 | 10/2015 | Nagatsuka et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0150464 | A1 * | 8/2004 | Khalid ........................ 327/541 |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki |
| 2011/0227072 | A1 * | 9/2011 | Inoue et al. ...................... 257/57 |
| 2011/0234260 | A1 * | 9/2011 | Oyama ............................. 327/89 |
| 2012/0163071 | A1 * | 6/2012 | Kurokawa ..................... 365/174 |
| 2012/0268849 | A1 * | 10/2012 | Tomatsu .......................... 361/56 |
| 2014/0269099 | A1 | 9/2014 | Nagatsuka et al. |
| 2015/0310906 | A1 | 10/2015 | Matsuzaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2014-19970 A | 10/2014 |
| JP | 2014-199708 A | 10/2014 |
| WO | 2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

(56) References Cited

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devies Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Depdendence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Jounral of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge Generation Layer", Adv. Mayer. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
KIMIZUKA.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa, Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 38, pp. 045501-1-045501-4.
Lee.H et al., "Current Status of, Challenges to, and perspective view of AM-OLED", IDW '06 : Proceedings of the 13th International Display Workshops, Dec. 7, 2006, pp. 663-666.
Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layers and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C ", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vaccum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch OVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide SemiConductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters) , Sep. 1, 2003, vol. 82, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

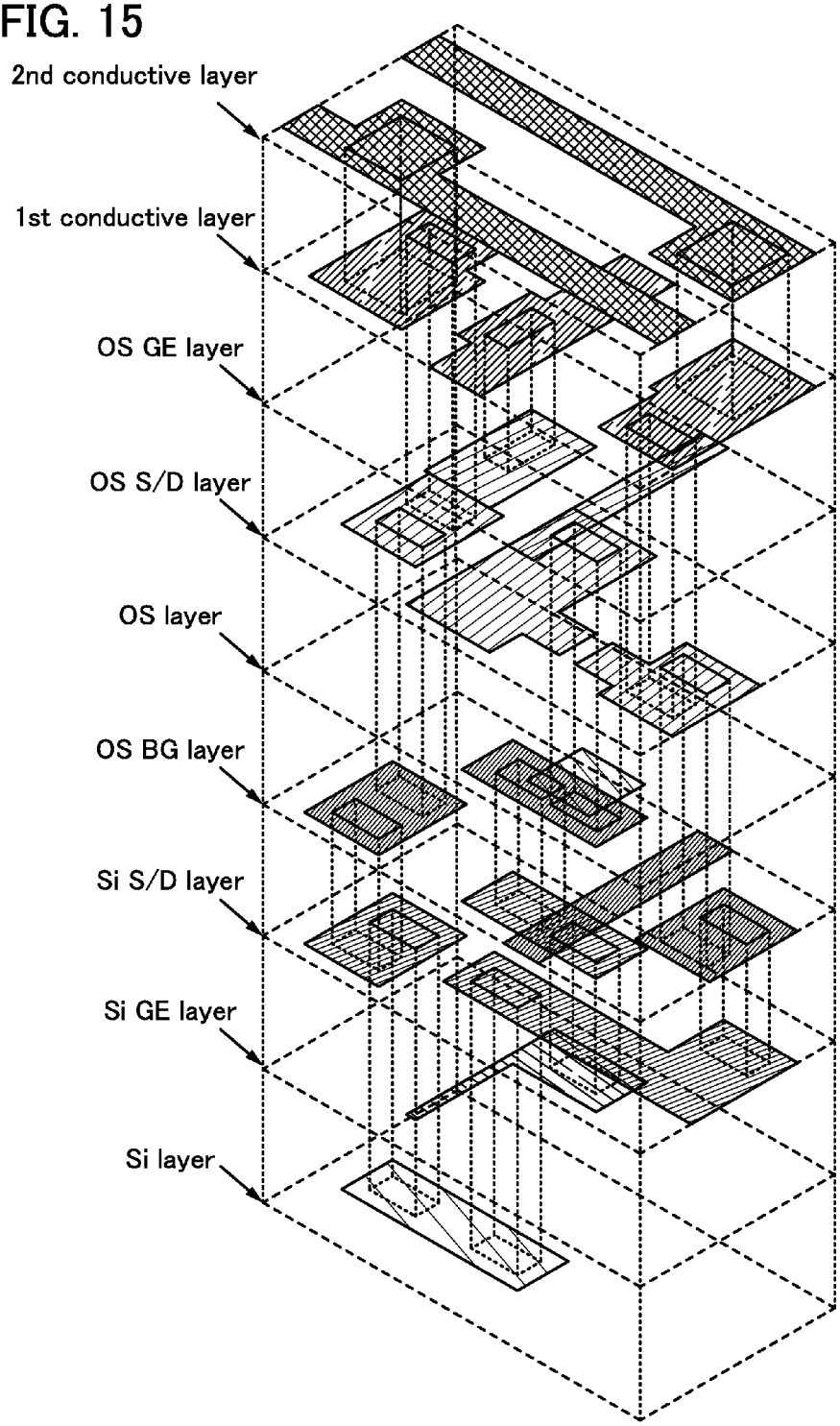

SEMICONDUCTOR DEVICE AND ELECTRONIC DEVICE

BACKGROUND OF THE INVENTION

1. Field of the Invention

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, an imaging device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

Much attention has been focused on a semiconductor device that retains multilevel data by using a combination of a transistor in which silicon (Si) is used for a semiconductor layer (hereinafter "Si transistor") and a transistor in which an oxide semiconductor (OS) is used for a semiconductor layer (hereinafter "OS transistor") (see Patent Documents 1 and 2).

REFERENCE

Patent Document 1: Japanese Published Patent Application No. 2014-199707

Patent Document 2: Japanese Published Patent Application No. 2014-199708

SUMMARY OF THE INVENTION

In Patent Documents 1 and 2, a voltage to be read is influenced by the threshold voltage of the Si transistor. The threshold voltage of the Si transistor changes depending on ambient temperatures or the like. Consequently, there is a possibility that a voltage to be read is affected by ambient temperatures or the like and correct data cannot be read.

An object of one embodiment of the present invention is to provide a novel semiconductor device, a novel electronic device, or the like.

Another object of one embodiment of the present invention is to provide a semiconductor device or the like with a novel structure capable of reading a read voltage affected by ambient temperatures or the like as correct data. Another object of one embodiment of the present invention is to provide a semiconductor device or the like with a novel structure capable of writing and reading multilevel data with an increased number of voltage levels to be retained.

Note that the objects of one embodiment of the present invention are not limited to the above. The objects described above do not preclude the existence of other objects. The other objects are objects that are not described above and will be described below. The other objects will be apparent from and can be derived from the description of the specification, the drawings, and the like by those skilled in the art. One embodiment of the present invention is to solve at least one of the above objects and the other objects.

One embodiment of the present invention is a semiconductor device including a memory cell and an A/D converter. The memory cell has a function of retaining a plurality of voltages. The memory cell includes a first transistor. The memory cell has a function of outputting a read voltage that is the sum of one of the plurality of voltages and the threshold voltage of the first transistor. The A/D converter has a function of comparing a corrected reference voltage and the read voltage to determine data corresponding to the plurality of voltages. The A/D converter includes a second transistor. The corrected reference voltage is the sum of a reference voltage and the threshold voltage of the second transistor.

In the semiconductor device of one embodiment of the present invention, the read voltage is preferably a voltage that is read out when a current corresponding to one of the plurality of voltages flows through the first transistor.

In the semiconductor device of one embodiment of the present invention, each of the first and second transistors preferably contains silicon in a channel formation region.

In the semiconductor device of one embodiment of the present invention, the corrected reference voltage is preferably a voltage obtained by supplying the reference voltage to a gate of the second transistor.

The semiconductor device of one embodiment of the present invention preferably includes a wiring supplied with the corrected reference voltage. It is preferred that the reference voltage be supplied to the gate of the second transistor, that the wiring be electrically connected to the second transistor through the switch, and that the corrected reference voltage be obtained by precharging the wiring, turning on the switch, and then discharging the wiring.

In the semiconductor device of one embodiment of the present invention, the memory cell preferably includes a third transistor. It is preferred that one of a source and a drain of the third transistor be electrically connected to a gate of the first transistor, and that the third transistor contain an oxide semiconductor in a channel formation region.

In the semiconductor device of one embodiment of the present invention, the A/D converter is preferably a flash A/D converter.

Note that other embodiments of the present invention will be described in Embodiments 1 to 6 with reference to the drawings.

One embodiment of the present invention can provide a novel semiconductor device, a novel electronic device, or the like.

One embodiment of the present invention can provide a semiconductor device or the like with a novel structure capable of reading a read voltage affected by ambient temperatures or the like as correct data. One embodiment of the present invention can provide a semiconductor device or the like with a novel structure capable of writing and reading multilevel data with an increased number of voltage levels to be retained.

Note that the effects of on embodiment of the present invention are not limited to the above. The effects described above do not preclude the existence of other effects. The other effects are ones that are not described above and will be described below. The other effects will be apparent from and can be derived from the description of the specification, the drawings, and the like by those skilled in the art. One embodiment of the present invention is to have at least one of the aforementioned effects and the other effects. Accordingly, one embodiment of the present invention does not have the aforementioned effects in some cases.

BRIEF DESCRIPTION OF THE DRAWINGS

In the accompanying drawings:

FIG. 15 is a schematic view illustrating one embodiment of the present invention;

DETAILED DESCRIPTION OF THE INVENTION

Figure 1:
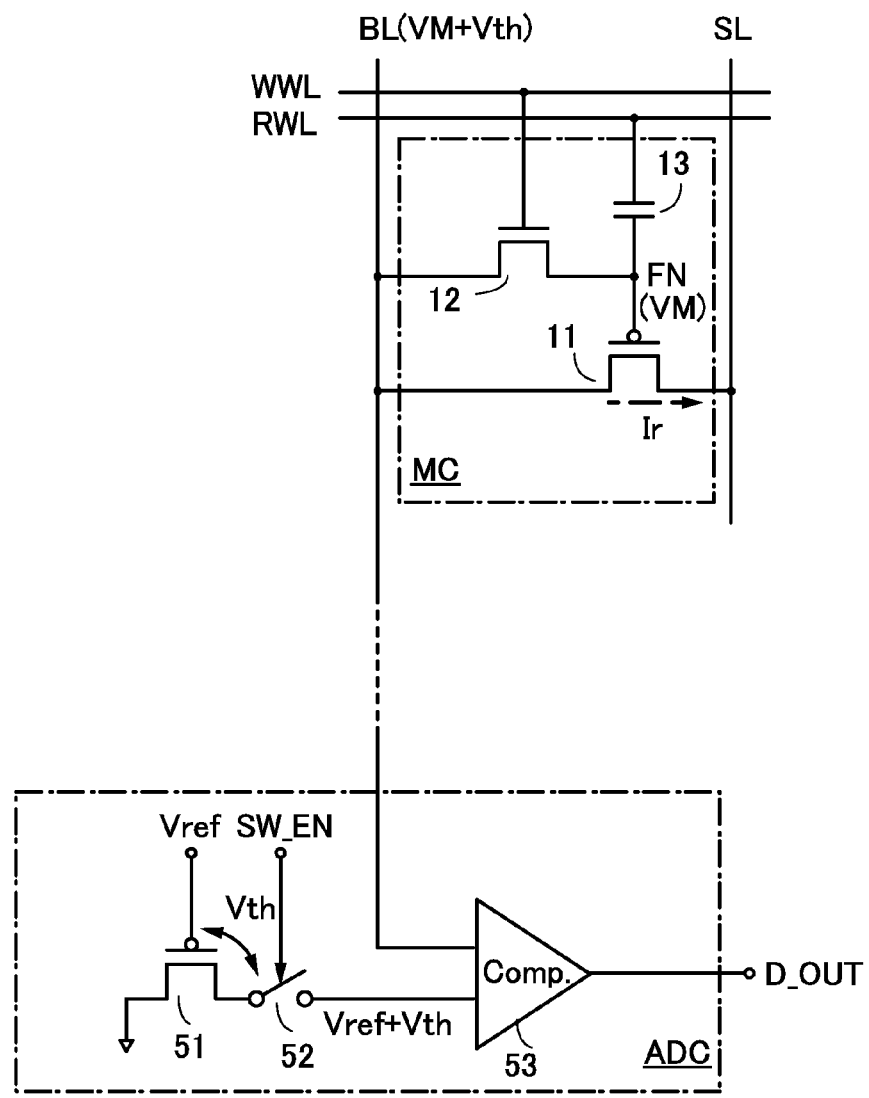
FIG. 1 is a circuit diagram illustrating one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components. For example, in this specification and the like, a "first" component in one embodiment can be referred to as a "second" component in other embodiments or claims. Furthermore, in this specification and the like, a "first" component in one embodiment can be referred to without the ordinal number in other embodiments or claims.

The same components, components having similar functions, components formed using the same material, components formed at the same time, or the like in the drawings are sometimes denoted by the same reference numerals, and the description thereof is not repeated in some cases.

(Embodiment 1)

In this embodiment, configurations of a memory cell and an analog-to-digital (A/D) converter included in a semiconductor device of one embodiment of the disclosed invention will be described.

FIG. 1 is a circuit diagram illustrating an example of a memory cell MC and an A/D converter ADC connected to the memory cell MC.

The memory cell MC illustrated in FIG. 1 includes a transistor 11, a transistor 12, and a capacitor 13. Although not illustrated in FIG. 1, a plurality of memory cells MC are arranged in a matrix.

The A/D converter ADC illustrated in FIG. 1 includes a transistor 51, a switch 52, and a comparator 53. Although not illustrated in FIG. 1, the A/D converter ADC includes a plurality of transistors 51, switches 52, and comparators 53 corresponding to the number of multilevel data retained in the memory cell MC.

The memory cell MC has a function of retaining a plurality of analog voltages at a node FN by turning off the transistor 12. The plurality of analog voltages correspond to multilevel data retained in the memory cell MC. Data is written and read with control of the on/off states of the transistors 11 and 12. The on/off states of the transistors 11 and 12 are controlled by signals transmitted to a wiring WWL and a wiring RWL.

Data is written to the memory cell MC by turning on the transistor 12 and supplying a potential of a wiring BL to the node FN. Data in the memory cell MC is retained by turning off the transistor 12 and maintaining charge at the node FN. Data in the memory cell MC is read out in such a manner that a potential of the precharged wiring BL that changes in accordance with charge retained at the node FN is read by the A/D converter.

A current Ir that flows between the wiring BL and the wiring SL decreases when the absolute value of a gate-source voltage Vgs of the transistor 11 becomes smaller than or equal to its threshold voltage Vth. The A/D converter ADC reads, as data retained in the memory cell MC, a potential read through the wiring BL or the wiring SL when the current Ir decreases.

Given that a voltage corresponding to charge retained at the node FN is VM, the potential read through the wiring BL or the wiring SL is VM+Vth, which is the sum of one of the plurality of analog voltages and the threshold voltage of the transistor 11. Note that VM+Vth is a voltage that makes Vgs, the absolute value of the difference between the potential VM at the node FN and the potential of the wiring SL, less than or equal to Vth. Moreover, VM+Vth can be referred to as a read voltage.

The A/D converter ADC has a function of comparing a read voltage read through the wiring BL or the wiring SL with a corrected reference voltage and generating a digital signal on the basis of the compared signals. The corrected reference voltage is a voltage obtained by turning on the switch 52 when a reference voltage Vref is applied to a gate of the transistor 51. Note that a wiring supplied with the corrected reference voltage is preferably precharged before the switch 52 is turned on. The on/off state of the switch 52 is controlled with a signal SW_EN.

Figure 20:
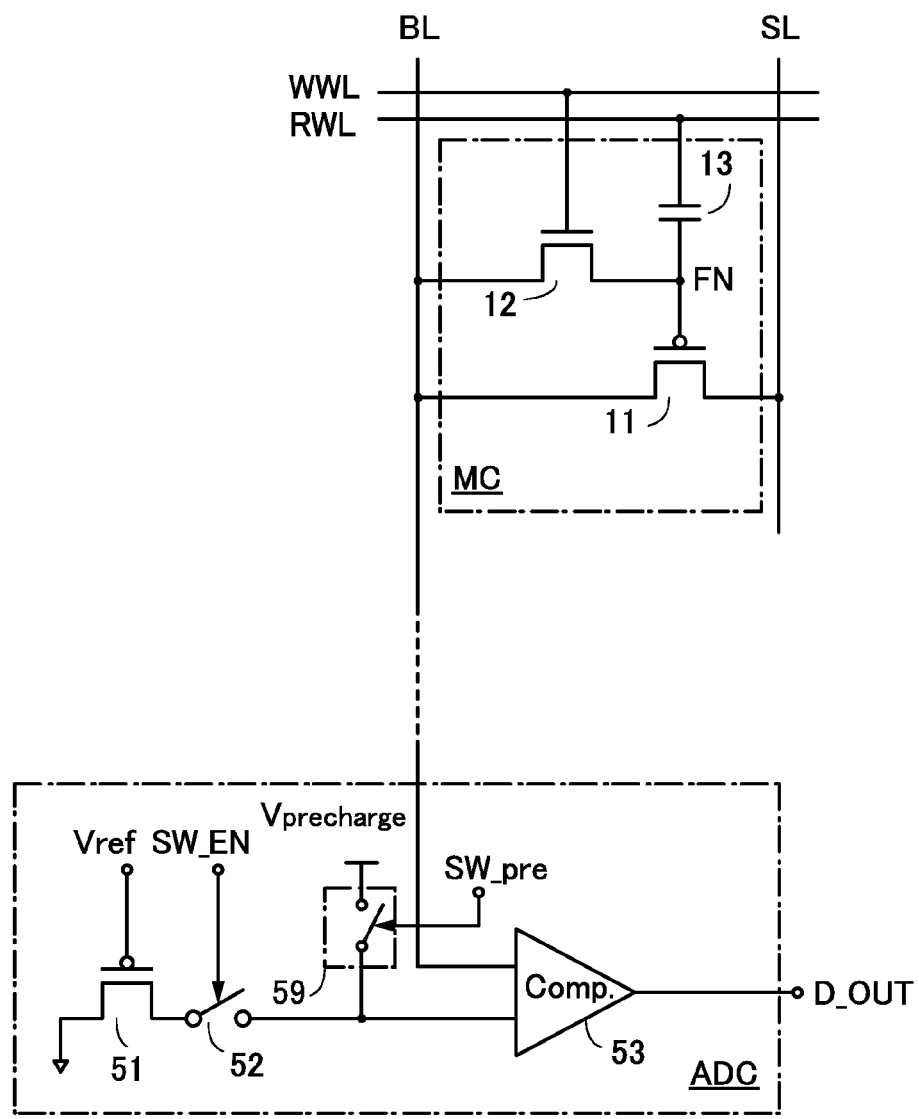
FIG. 20 is a circuit diagram illustrating one embodiment of the present invention.
Figure 21:
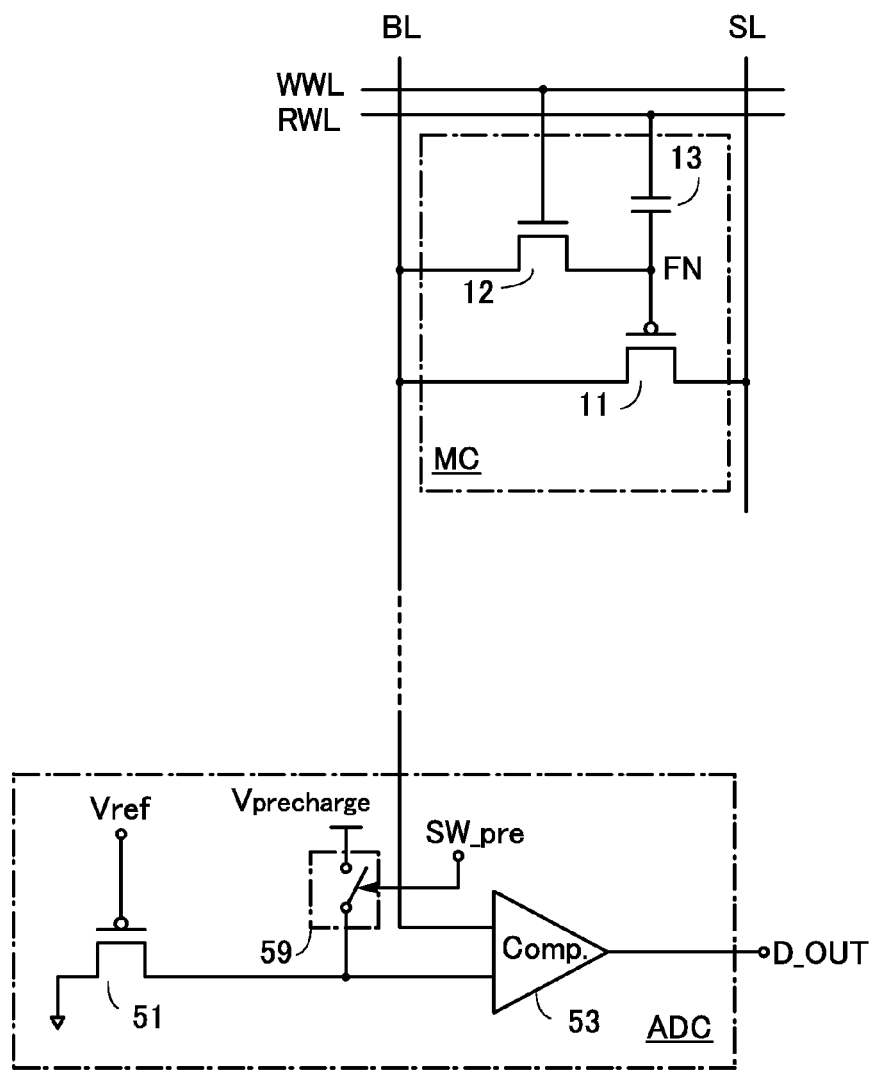
FIG. 21 is a circuit diagram illustrating one embodiment of the present invention.

To precharge the wiring supplied with the corrected reference voltage, for example, it is possible to employ a configuration in FIG. 20 in which a precharge voltage $V_{precharge}$ is supplied through a switch 59 controlled with a signal SW_pre. When the wiring is precharged using the switch 59 as illustrated in FIG. 20, the switch 52 can be omitted as illustrated in FIG. 21. In the following explanation, the configuration in which precharge is performed using the switch 59 is described as an example; alternatively, the wiring supplied with the corrected reference voltage can be precharged through the transistor 51 and the switch 52 by changing the potential of a wiring connected to the transistor 51.

The transistor 51 whose gate is supplied with the reference voltage Vref has the same conductivity type as the transistor 11 and has substantially the same threshold voltage Vth. Accordingly, charge of the precharged wiring supplied with the corrected reference voltage is released by turning on the switch 52 connected to the transistor 51. By this discharge, the corrected reference voltage supplied to an input terminal of the comparator 53 becomes Vref+Vth, the sum of the reference voltage Vref and the threshold voltage Vth of the transistor 51.

As described above, the memory cell MC having the configuration of this embodiment outputs VM+Vth, which includes the threshold voltage of the transistor 11, as a read voltage read from the memory cell MC. The threshold voltage of the transistor 11 depends on the change in ambient temperature or the like. If the threshold voltage varies, the read voltage varies and correct data cannot be output when the A/D converter ADC compares the read voltage with the corrected reference voltage and performs A/D conversion; thus, the reliability of obtained data is lowered.

In light of the above, the A/D converter ADC having the configuration of this embodiment uses Vref+Vth, which can deal with a variation in the threshold voltage of the transistor 11, as the corrected reference voltage to be compared with the read voltage VM+Vth. Specifically, the A/D converter ADC is provided with the transistor 51 and performs A/D conversion of the read voltage with the use of the corrected reference voltage Vref+Vth, which is obtained by adding the threshold voltage of the transistor 51 to the reference voltage Vref under control of the switch 52.

The value of the corrected reference voltage, which includes the threshold voltage of the transistor 51, can be changed in accordance with a variation in the threshold voltage of the transistor 11. Accordingly, the read voltage can be subjected to A/D conversion after a variation in the corrected reference voltage due to the threshold voltage of the transistor 51 cancels out a variation in the read voltage due to threshold voltage of the transistor 11. It is therefore possible to obtain a semiconductor device from which a read voltage affected by ambient temperatures or the like can be read as correct data.

In the semiconductor device described in this embodiment, data can be read while the adverse effect of a threshold voltage variation due to the change in ambient temperature or the like is decreased; thus, there is no need of a large potential difference between the corrected reference voltage and the read voltage. In other words, a plurality of read voltages and corrected reference voltages can be set within the range of voltage capable of being retained, so that multilevel data can be written and read with the increased number of voltage levels to be retained in the memory cell MC.

Figure 2A:
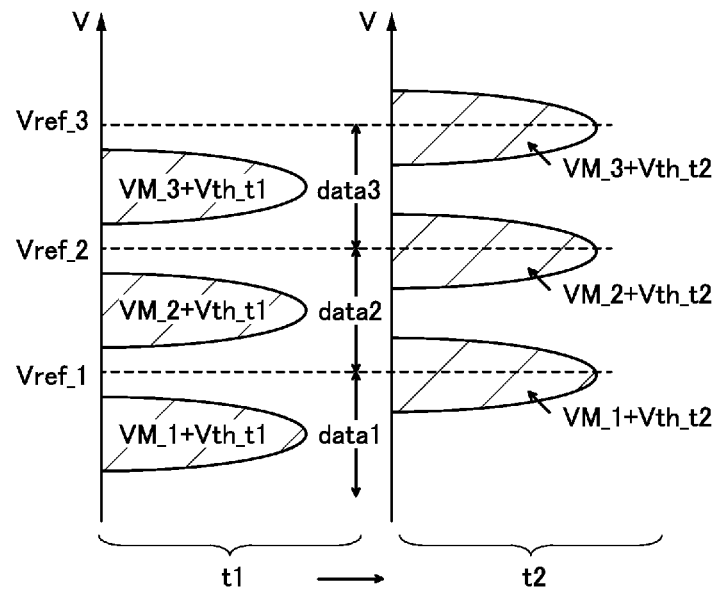
FIGS. 2A and 2B are diagrams illustrating one embodiment of the present invention.
Figure 2B:
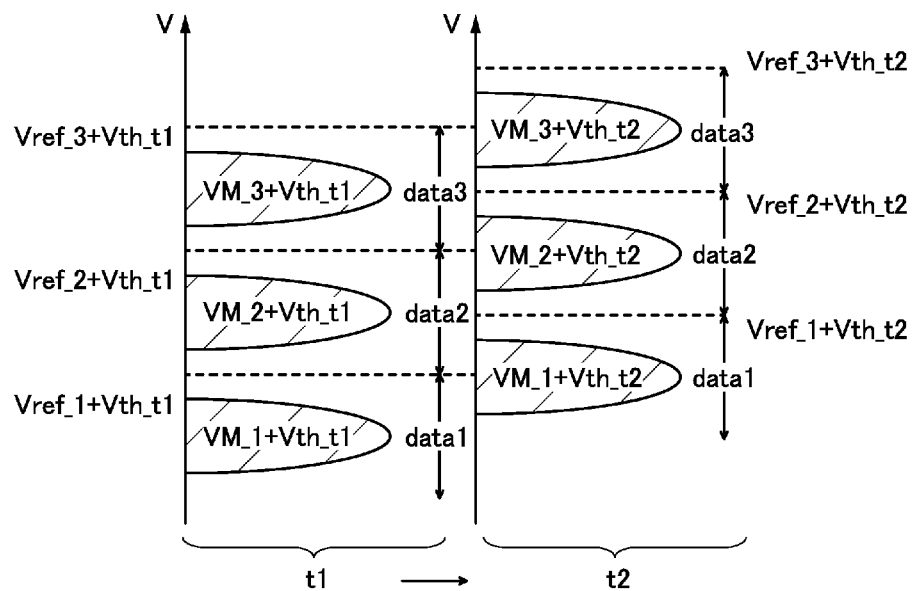

FIGS. 2A and 2B each show changes in read voltage and corrected reference voltage when the threshold voltage varies because of the ambient temperature change or the like. For comparison, FIG. 2A illustrates the case where the A/D converter uses a reference voltage to which the threshold voltage is not added (i.e., a reference voltage without correction), whereas FIG. 2B illustrates the case where the A/D converter uses a corrected reference voltage to which the threshold voltage is added.

FIGS. 2A and 2B each illustrate distribution of read voltages for data1 to data3 at temperatures t1 and t2. FIGS. 2A and 2B represent the case where the threshold voltage increases as the temperature changes from t1 to t2. In FIGS. 2A and 2B, the threshold voltage at the temperature t1 is denoted by Vth_t1, and that at the temperature t2 is denoted by Vth_t2. As non-corrected reference voltages used for A/D conversion, Vref_1 to Vref_3 are used in FIG. 2A. In FIG. 2B, Vref_1 to Vref_3 are used as reference voltages, and as actual corrected reference voltages, Vref_1+Vth_t1 to Vref_3+Vth_t1 are used at the temperature t1 and Vref_1+Vth_t2 to Vref_3+Vth_t2 are used at the temperature t2. In FIGS. 2A and 2B, VM_1 to VM_3 represent read voltages that depend on data.

In FIG. 2A, as the temperature changes from t1 to t2, read voltages VM_1+Vth_t1 to VM_3+Vth_t1 increase to VM_1+Vth_t2 to VM_3+Vth_t2. Since the non-corrected reference voltages Vref_1 to Vref_3 used for A/D conversion are fixed in FIG. 2A, the read voltage for predetermined data at the temperature t1 is hard to read out as correct data at the temperature t2.

In contrast, in FIG. 2B, as the temperature changes from t1 to t2, the read voltages VM_1+Vth_t1 to VM_3+Vth_t1 increase to VM_1+Vth_t2 to VM_3+Vth_t2 by a threshold voltage variation, and in addition, reference voltages Vref_1+Vth_t1 to Vref_3+Vth_t1 increase to Vref_1+Vth_t2 to Vref_3+Vth_t2. Thus, the magnitude relation between the corrected reference voltage and the read voltage is not changed by the temperature change, and the read voltage can be read as correct data.

<Configuration Example of Memory Cell MC>

Next, the configuration of the memory cell MC illustrated in FIG. 1 will be described.

A gate of the transistor 11 is connected to one of a source and a drain of the transistor 12. One of a source and a drain of the transistor 11 is connected to the wiring BL. The other of the source and the drain of the transistor 11 is connected to the wiring SL. Although FIG. 1 shows a p-channel transistor as the transistor 11, the transistor 11 may be an n-channel transistor.

Figure 19:
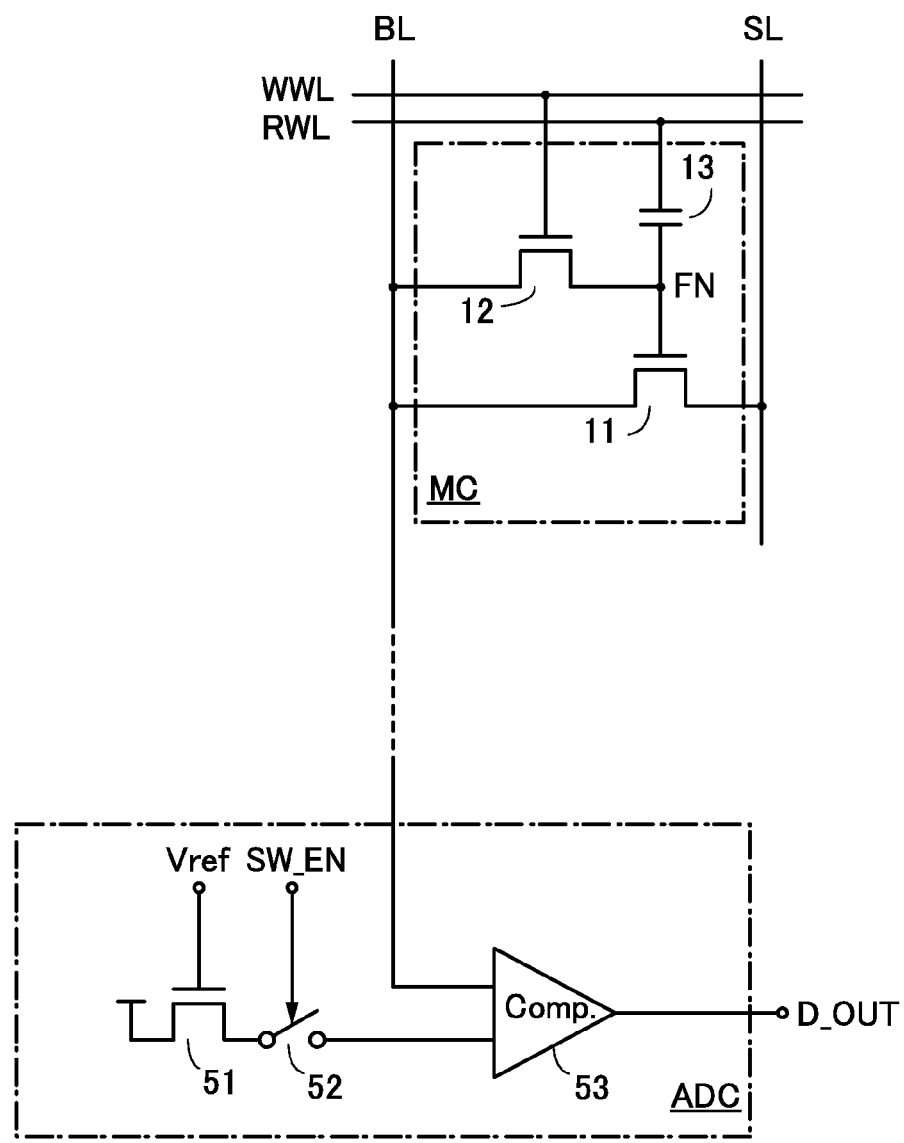
FIG. 19 is a circuit diagram illustrating one embodiment of the present invention.

When the transistor 11 is an n-channel transistor, an n-channel transistor is also used as the transistor 51 in the A/D converter ADC as illustrated in FIG. 19. When the transistors 11 and 51 are n-channel transistors, the potential levels need to be inverted, for example, the potential of a wiring supplied with a ground potential is set to a potential VDD.

The transistor 11 is preferably a transistor containing silicon in its channel formation region (Si transistor). Si transistors fabricated through the same process can have a small threshold voltage variation owing to impurity addition or the like, resulting in a smaller variation in threshold voltage added to the read voltage. Note that it is preferred that the transistor 51, which has the same conductivity type as the transistor 11, be also a Si transistor because the characteristics such as threshold voltage Vth can be the same between the transistors 11 and 51.

A gate of the transistor 12 is connected to the wiring WWL. The other of the source and the drain of the transistor 12 is connected to the wiring BL. The node FN is a node between the transistor 11 and the transistor 12. Although FIG. 1 shows an n-channel transistor as the transistor 12, the transistor 12 may be a p-channel transistor.

The transistor 12 functions as a switch controlling data writing and retention. The transistor 12 is preferably a transistor in which a current flowing between the source and drain in the off state (off-state current) is low. A transistor with a low off-state current is preferably a transistor containing an oxide semiconductor in its channel formation region (OS transistor). An OS transistor has advantages such as a low off-state current and the capability of being formed to overlap a Si transistor. An OS transistor will be described in detail below.

One electrode of the capacitor 13 is connected to the node FN. The other electrode of the capacitor 13 is connected to the wiring RWL.

A write word signal is supplied to the wiring WWL. The write word signal is a signal for turning on the transistor 12 so that the voltage of the wiring BL is supplied to the node FN.

The wiring BL is supplied with multilevel data and the precharge voltage $V_{precharge}$ for reading data. The wiring BL may also be supplied with another voltage, for example, a voltage for initialization. The wiring BL is made electrically floating after being supplied with the precharge voltage $V_{precharge}$.

Multilevel data is k-bit data (k is a natural number of 2 or more). Specifically, 2-bit data is 4-level data, namely, a signal having any one of the four levels of voltages.

The precharge voltage $V_{precharge}$ is supplied to the wiring BL to read data. The wiring BL becomes electrically floating after being supplied with the precharge voltage $V_{precharge}$.

The wiring RWL is supplied with a read signal. The read signal is supplied to the other electrode of the capacitor 13 so that data is selectively read from the memory cell MC.

The wiring SL is supplied with a voltage lower than the precharge voltage $V_{precharge}$, which is supplied to the wiring BL, for example, a ground voltage $V_{GND}$.

<Operation Example of Memory Cell MC>

Next, an operation example of the memory cell MC will be described with reference to timing charts and circuit diagrams. Japanese Published Patent Application No. 2014-199707, applied by the present applicants, is referred to for the details of the operation of the memory cell MC.

Figure 3A:
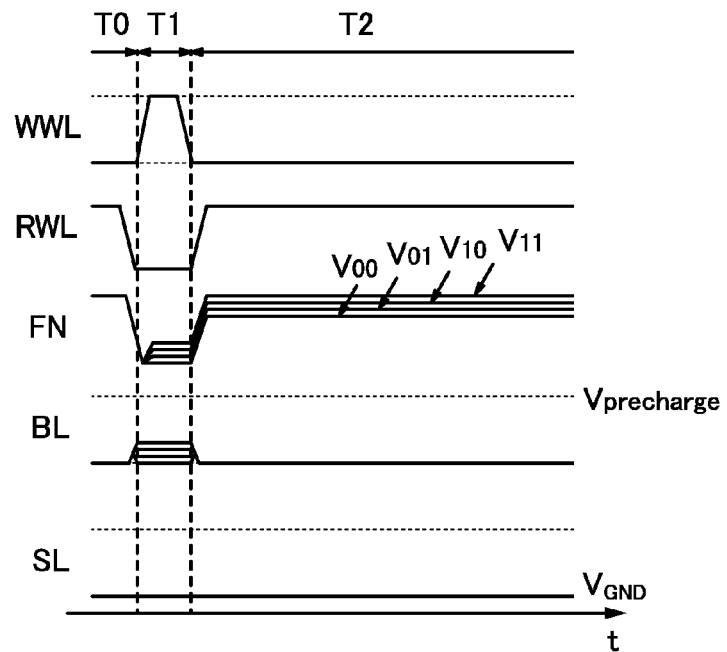
FIGS. 3A and 3B are timing charts illustrating one embodiment of the present invention.
Figure 4A:
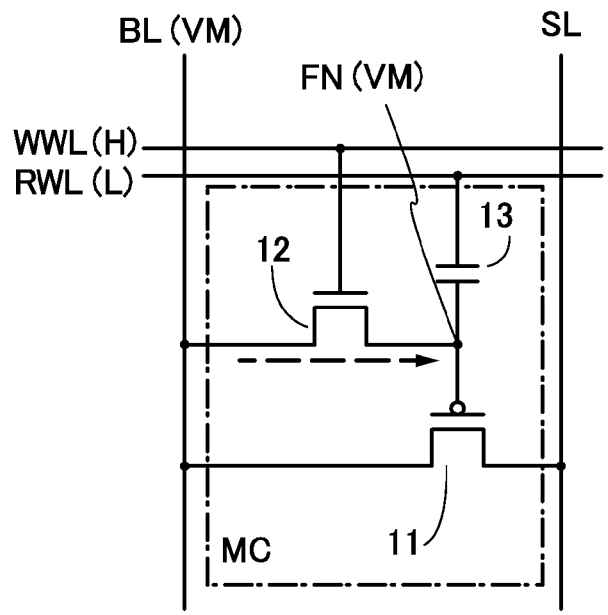
FIGS. 4A and 4B are circuit diagrams illustrating one embodiment of the present invention.
Figure 4B:
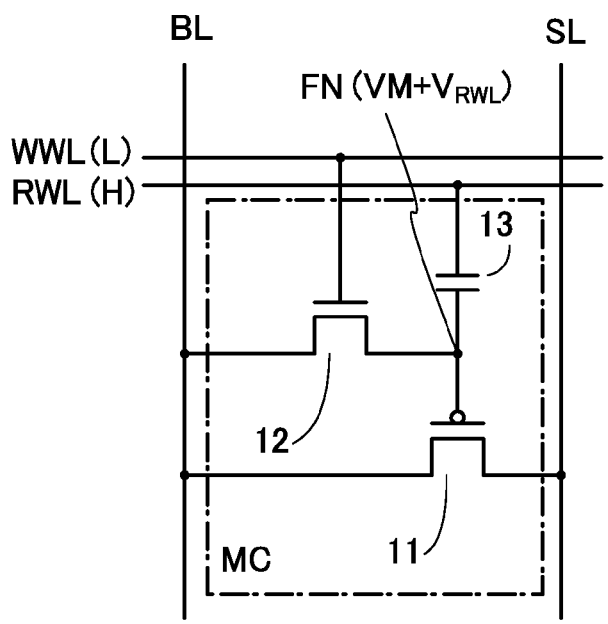

Data writing to the memory cell MC can be described using the timing chart in FIG. 3A and the circuit diagrams in FIGS. 4A and 4B.

The timing chart in FIG. 3A illustrates a period T0 that is in an initialization state, a period T1 for writing data to the memory cell MC, and a period T2 for retaining data in the memory cell MC. The timing chart in FIG. 3A shows changes in signals supplied to the wiring WWL, the wiring RWL, the node FN, the wiring BL, and the wiring SL illustrated in FIG. 1.

The circuit diagram in FIG. 4A illustrates the state in the period T1. The circuit diagram in FIG. 4B illustrates the state in the period T2. When multilevel data is four-level data, for example, the voltage VM of data supplied to the wiring BL is one of four voltages ($V_{00}$, $V_{01}$, $V_{10}$, and $V_{11}$). A dotted arrow in FIG. 4A indicates the flow of charge at the time of writing data to the memory cell MC. Moreover, "H" and "L" in FIGS. 4A and 4B represent high level and low level of a signal.

Data is written in the following manner.

First, in the period T0, the wiring WWL is set low, the transistor 12 is turned off, and the node FN is made electrically floating. While the node FN is electrically floating, the wiring RWL is changed from high to low. Thus, the potential of the node FN is decreased by capacitive coupling of the capacitor 13.

In the period T1, the wiring WWL is set high, the transistor 12 is turned on, and the potential VM of the wiring BL is supplied to the node FN. The potential of the node FN depends on the level of the potential VM.

In the period T2, the wiring WWL is set low, the transistor 12 is turned off, and the node FN is made electrically floating. While the node FN is electrically floating, the wiring RWL is changed from low to high. Consequently, the potential of the node FN increases from the potential VM by a given potential ($V_{RWL}$). Data writing is completed, and the written data is retained at the node FN in the memory cell MC.

Figure 3B:
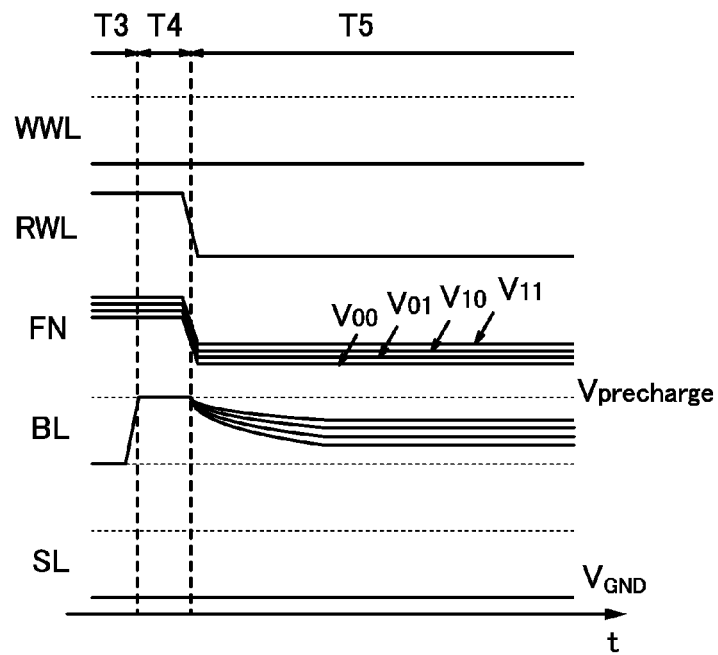
Figure 5A:
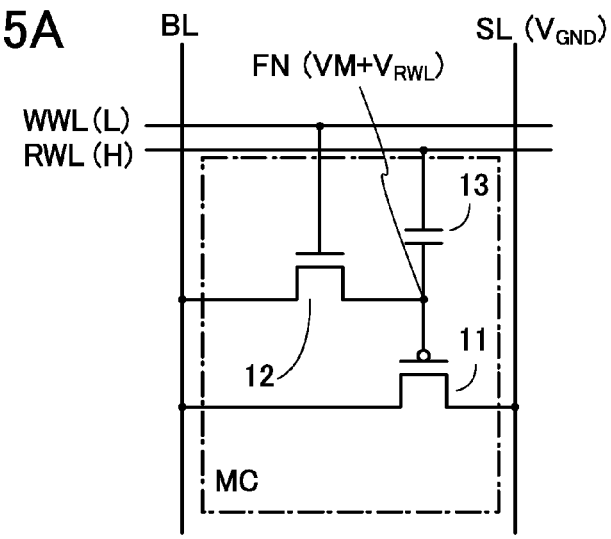
FIGS. 5A to 5C are circuit diagrams illustrating one embodiment of the present invention.
Figure 5B:
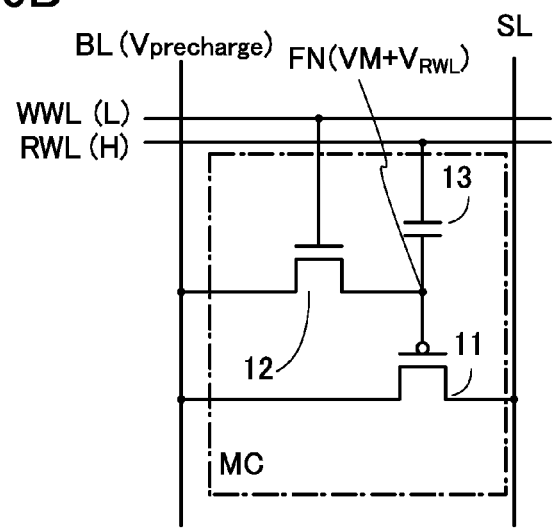
Figure 5C:
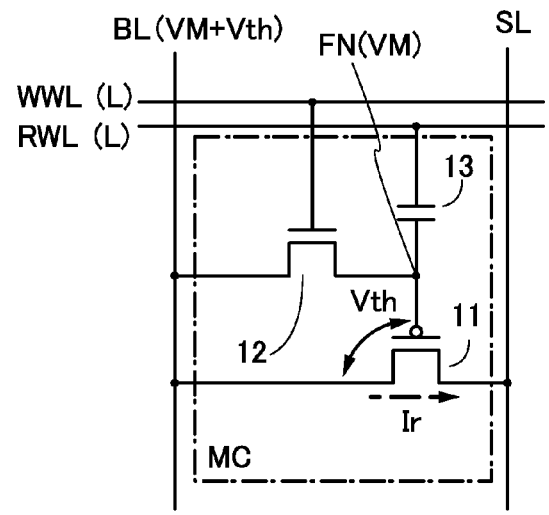

Next, data reading from the memory cell MC can be described using the timing chart in FIG. 3B and the circuit diagrams in FIGS. 5A to 5C.

The timing chart in FIG. 3B illustrates a period T3 during which data is retained, a period T4 for precharging the wiring BL, and a period T5 for reading data from the memory cell MC. The timing chart in FIG. 3B shows changes in signals supplied to the wiring WWL, the wiring RWL, the node FN, the wiring BL, and the wiring SL illustrated in FIG. 1.

The circuit diagram in FIG. 5A illustrates the state in the period T3. The circuit diagram in FIG. 5B illustrates the state in the period T4. The circuit diagram in FIG. 5C illustrates the state in the period T5. When multilevel data is four-level data, for example, a voltage read through the wiring BL is a voltage with one of four levels ($V_{00}$, $V_{01}$, $V_{10}$, and $V_{11}$). A dotted arrow in FIG. 5C indicates the flow of charge at the time of reading data from the memory cell MC. Note that "Vth" in FIG. 5C represents the threshold voltage of the transistor 11, and "H" and "L" in FIGS. 5A to 5C represent high level and low level of a signal.

Data is read out in the following manner.

First, in the period T3, the wiring WWL is set low, and the transistor 12 is turned off. After that, the transistor 12 remains off during data reading. Moreover, in the period T3, the wiring RWL is set high, and the potential VM+$V_{RWL}$ of the node FN, which is retained in the period T2, is maintained. The potential of the wiring SL is the ground voltage $V_{GND}$.

In the period T4, the wiring BL is precharged with the potential $V_{precharge}$. In the period T4, the wiring RWL remains high so that the potential VM+$V_{RWL}$ of the node FN, which is retained in the period T2, is maintained.

In the period T5, the node FN is made electrically floating, and the potential of the wiring RWL is changed from high to low. Thus, the potential of the node FN decreases from the potential VM+$V_{RWL}$ by a given potential ($V_{RWL}$) and becomes the potential VM of the original data. The current Ir corresponding to the potential VM flows through the transistor 11. When the current Ir flows, the potential of the wiring BL decreases from the potential $V_{precharge}$. The decrease in potential of the wiring BL stops when the gate-source voltage Vgs of the transistor 11 becomes its threshold voltage Vth, because the current Ir decreases. Since the gate potential of the transistor 11 is the potential VM, the potential of the wiring BL that makes Vgs of the transistor 11 Vth is the potential VM+Vth. When multilevel data is four-level data, for example, VM+Vth corresponds to one of four voltages ($V_{00}$, $V_{01}$, $V_{10}$, and $V_{11}$), like the potential VM retained at the node FN. That is, the potential of the wiring BL can be a potential corresponding to data. Thus, data readout to the wiring BL is completed, and the read data can be supplied to the A/D converter ADC through the wiring BL.

<Configuration Example of A/D Converter>

Figure 6A:
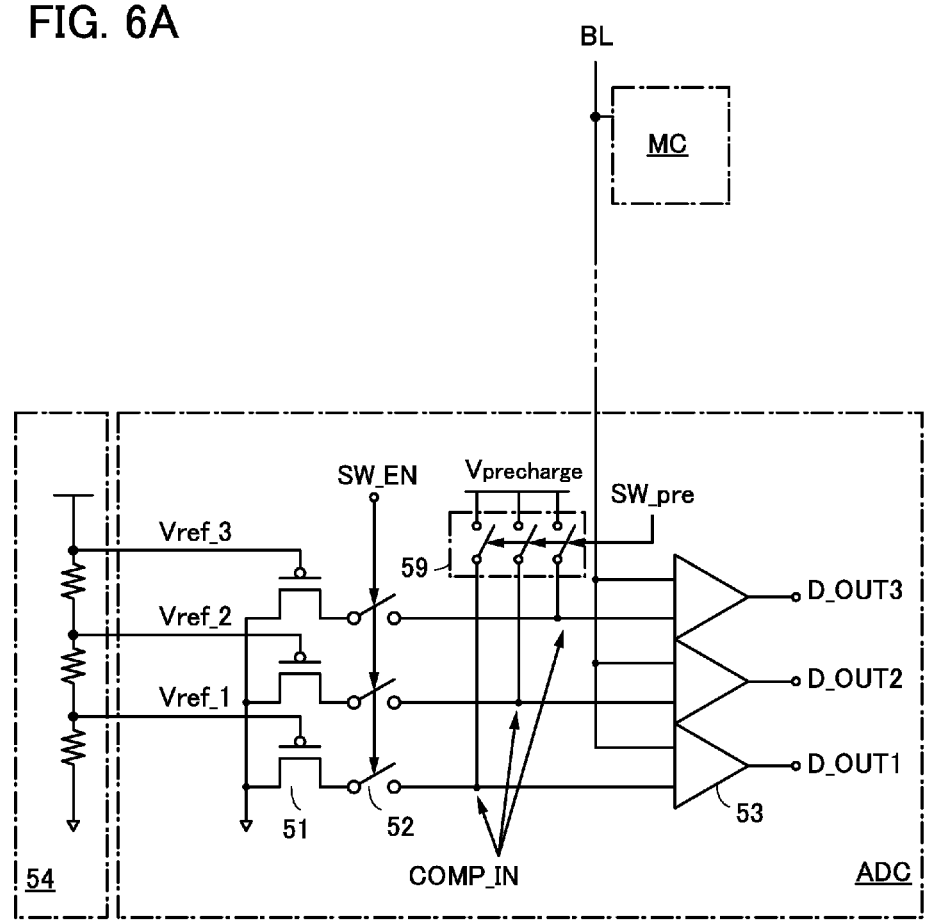
FIGS. 6A and 6B are a circuit diagram and a timing chart illustrating one embodiment of the present invention.

FIG. 6A shows an example of a circuit diagram of the A/D converter ADC for converting voltages corresponding to four-level data. In FIG. 6A, an input terminal of the comparator 53 to which a corrected reference voltage is supplied is denoted by a terminal COMP_IN, and the switch 59 for precharging the terminal COMP_IN is shown. The switch 59 is controlled by the signal SW_pre. To generate the corrected reference voltage, the switch 59 is turned on, and the voltage $V_{precharge}$ is supplied to the terminal COMP_IN.

The reference voltages Vref_1 to Vref_3 are supplied to the gates of the transistors 51 in the A/D converter ADC from a voltage generator circuit 54. With the use of the reference voltages Vref_1 to Vref_3 obtained from the voltage generator circuit 54, the potentials of the precharged terminals COMP_IN can be set to Vref_1+Vth to Vref_3+Vth. The voltage generator circuit 54 is, for example, a circuit in which resistors are connected in series as illustrated in FIG. 6A.

In output signals D_OUT1 to D_OUT3 obtained by comparison in the comparators 53, a threshold voltage variation due to the change in ambient temperature or the like is canceled. Thus, the obtained digital data is highly reliable.

<Operation Example of A/D Converter>

Next, an operation example of the A/D converter ADC will be described with reference to the timing chart of FIG. 6B.

Figure 6B:
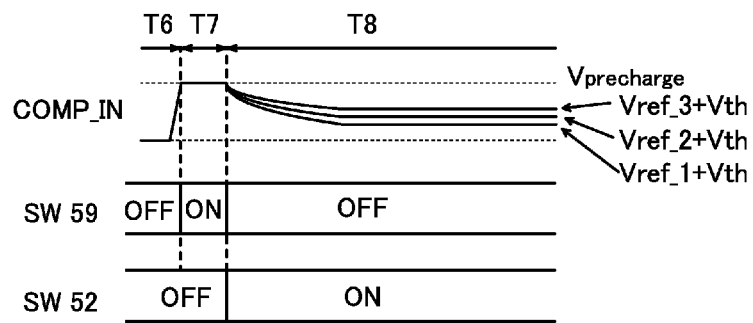

The timing chart in FIG. 6B shows a period T6 that is in a standby state, a period T7 for precharging, and a period T8 for generating reference voltages.

The operation of the A/D converter ADC for generating reference voltages each including a voltage corresponding to a threshold voltage variation is as follows.

First, in the period T6, the switches 52 and the switches 59 are turned off. Note that OS transistors with a low off-state current are preferably used as the switches 52 and 59. In the period during which the switches 52 and 59 are off, a current for generating a corrected reference voltage does not flow through the A/D converter ADC, which means that power consumption in this period can be decreased.

In the period T7, the switches 59 are turned on under control of the signal SW_pre, and the terminals COMP_IN are precharged with the potential $V_{precharge}$.

In the period T8, the switches 52 are turned on under control of the signal SW_EN; thus, currents corresponding to the reference voltages Vref_1 to Vref_3 at the gates of the transistors 51 flow through the transistors 51. When the currents flow through the transistors 51, the potentials of the terminals COMP_IN decrease from the potential $V_{precharge}$. The decrease in potential of the terminals COMP_IN stops when Vgs of each the transistors 51 becomes Vth, because the currents flowing through the transistors 51 decrease. Since the gate potentials of the transistors 51 are the potentials Vref_1 to Vref_3, the potentials of the terminals COMP_IN that make Vgs of the transistors 51 Vth are the potentials Vref_1+Vth to Vref_3+Vth. Note that Vref_1+Vth to Vref_3+Vth can be used as corrected reference voltages including a voltage corresponding to a threshold voltage variation. Accordingly, the corrected reference voltages can be voltages considering a threshold voltage variation due to the change in ambient temperature or the like.

<Block Diagram of Semiconductor Device>

Figure 7:
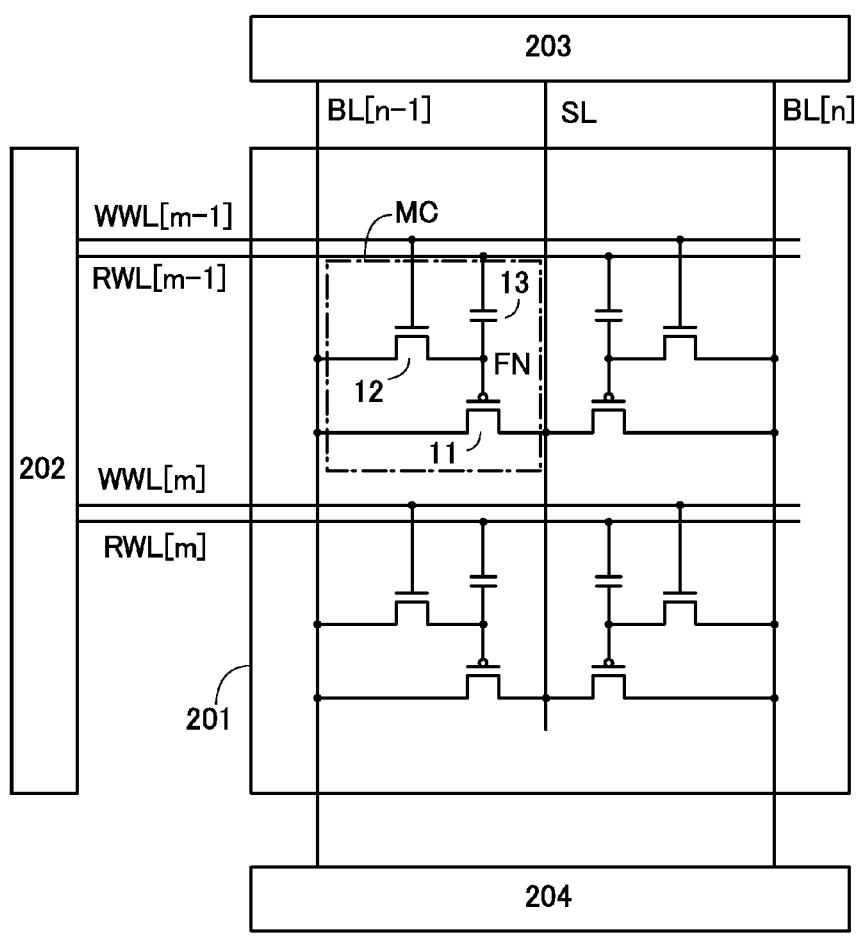
FIG. 7 is a circuit diagram illustrating one embodiment of the present invention.

FIG. 7 is a block diagram illustrating a configuration example of a semiconductor device including the memory cell MC and the A/D converter ADC shown in FIG. 1.

A semiconductor device 200 illustrated in FIG. 7 includes a memory cell array 201 including a plurality of memory cells MC described using FIG. 1, a row driver 202, a column driver 203, and a read circuit 204. The semiconductor device 200 includes the memory cells MC arranged in a matrix with m rows and n columns. FIG. 7 also shows a wiring WWL[m−1] and a wiring RWL[m−1] in the (m−1)th row, a wiring WWL[m] and a wiring RWL[m] in the m-th row, a wiring BL[n−1] in the (n−1)th column, a wiring BL[n] in the n-th column, and the wiring SL.

In the memory cell array 201 in FIG. 7, the memory cells MC illustrated in FIG. 1 are arranged in a matrix. Note that the components of the memory cell MC are the same as those in FIG. 1; thus, the description of the components is omitted here and the description of FIG. 1 can be referred to.

In the memory cell array 201 shown in FIG. 7, the wiring SL is shared by adjacent memory cells. With such a configuration, the area occupied by the wiring SL is reduced. Thus, the semiconductor device with the configuration can have high memory capacity per unit area.

The row driver 202 has functions of selectively turning on the transistor 12 in the memory cells MC of each row and selectively changing the potential of the node FN in the memory cells MC of each row. Specifically, the row driver 202 supplies a write word signal to the wiring WWL and supplies a read signal to the wiring RWL. The row driver 202 enables the semiconductor device 200 to select the memory cells MC to/from which data is written/read row by row.

The column driver 203 has functions of selectively writing data to the node FN in the memory cells MC of each column, discharging the wiring BL, and bringing the wiring BL into an electrically floating state. Specifically, the column driver 203 supplies a potential corresponding to multilevel data to the wiring BL and supplies a precharge voltage $V_{precharge}$ to the wiring BL. The column driver 203 enables the semiconductor device 200 to select the memory cells MC to/from which data is written/read column by column.

The read circuit 204 includes the A/D converter ADC described above. The read circuit 204 has a function of converting the potential of the wiring BL, which is an analog value, into a digital value and outputting the digital value to the outside. As described above, A/D conversion is performed by comparing a corrected reference voltage and an analog potential with the use of the comparator included in the A/D converter ADC. The read circuit 204 enables the semiconductor device 200 to output, to the outside, the potential of the wiring BL that corresponds to data read from the memory cell MC.

Note that the A/D converter ADC included in the read circuit 204 can employ another configuration as long as it operates using a corrected reference voltage. Although a flash A/D converter is used in the above description, a successive approximation A/D converter, a multi-slope A/D converter, or a delta-sigma A/D converter may be used.

<Summary>

As described above, the memory cell MC having the configuration of this embodiment outputs a voltage including the threshold voltage of the transistor 11 as a read voltage read from the memory cell MC. The A/D converter ADC having the configuration of this embodiment uses a voltage that can deal with a variation in the threshold voltage of the transistor 11 as the reference voltage to be compared with the read voltage. Accordingly, the read voltage can be subjected to A/D conversion after a variation in the corrected reference voltage due to the threshold voltage of the transistor 51 cancels out a variation in the read voltage due to threshold voltage of the transistor 11. It is therefore possible to obtain a semiconductor device from which a read voltage affected by ambient temperatures or the like can be read as correct data.

(Embodiment 2)

This embodiment will show variation examples of configurations of the memory cell MC and the A/D converter ADC described in Embodiment 1.

<Variation Examples of Memory Cell MC>

FIGS. 8A to 8E illustrate examples of a circuit configuration that the memory cell MC in FIG. 1 can have.

Figure 8A:
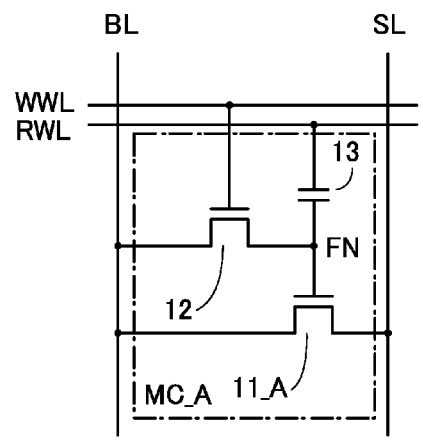
FIGS. 8A to 8E are circuit diagrams each illustrating one embodiment of the present invention.

A memory cell MC_A illustrated in FIG. 8A includes a transistor 11_A, the transistor 12, and the capacitor 13. The transistor 11_A is an n-channel transistor. The memory cell MC in FIG. 1 can employ the configuration in FIG. 8A.

Figure 8B:
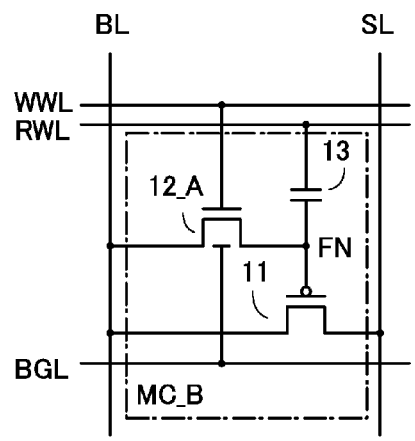

A memory cell MC_B illustrated in FIG. 8B includes the transistor 11, a transistor 12_A, and the capacitor 13. The transistor 12_A includes a backgate that can be controlled by a wiring BGL. This configuration enables control of the threshold voltage of the transistor 12_A. The memory cell MC in FIG. 1 can employ the configuration in FIG. 8B.

Figure 8C:
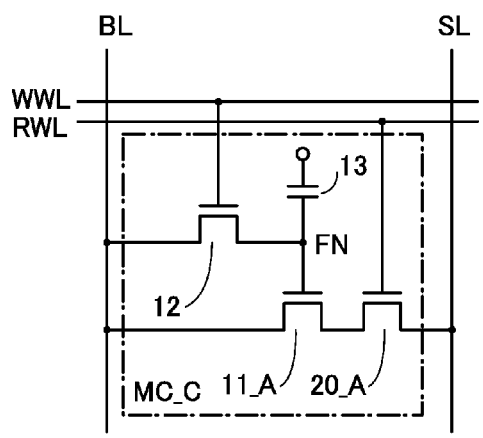

A memory cell MC_C illustrated in FIG. 8C includes the transistor 11_A, the transistor 12, the capacitor 13, and a transistor 20_A. The transistor 20_A is an n-channel transistor like the transistor 11_A. The memory cell MC in FIG. 1 can employ the configuration in FIG. 8C.

Figure 8D:
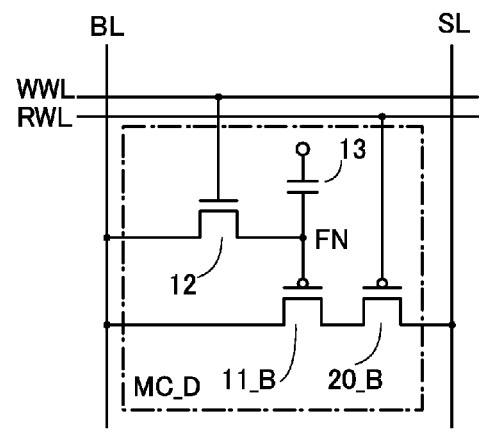

A memory cell MC_D illustrated in FIG. 8D includes a transistor 11_B, the transistor 12, the capacitor 13, and a transistor 20_B. The transistor 11_B and the transistor 20_B are p-channel transistors. The memory cell MC in FIG. 1 can employ the configuration in FIG. 8D.

Figure 8E:
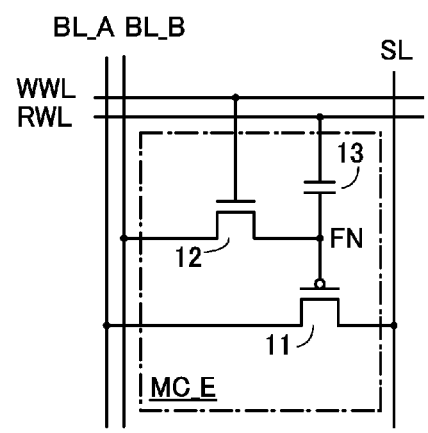

A memory cell MC_E illustrated in FIG. 8E includes the transistor 11, the transistor 12, and the capacitor 13. The transistor 11 is connected to a bit line BL_A. The transistor 12 is connected to a bit line BL_B. In the configuration of FIG. 8E, the bit line BL_A can be used for data reading and the bit line BL_B can be used for data writing, for example. The memory cell MC in FIG. 1 can employ the configuration in FIG. 8E.

<Variation Examples of A/D Converter>

Figure 9:
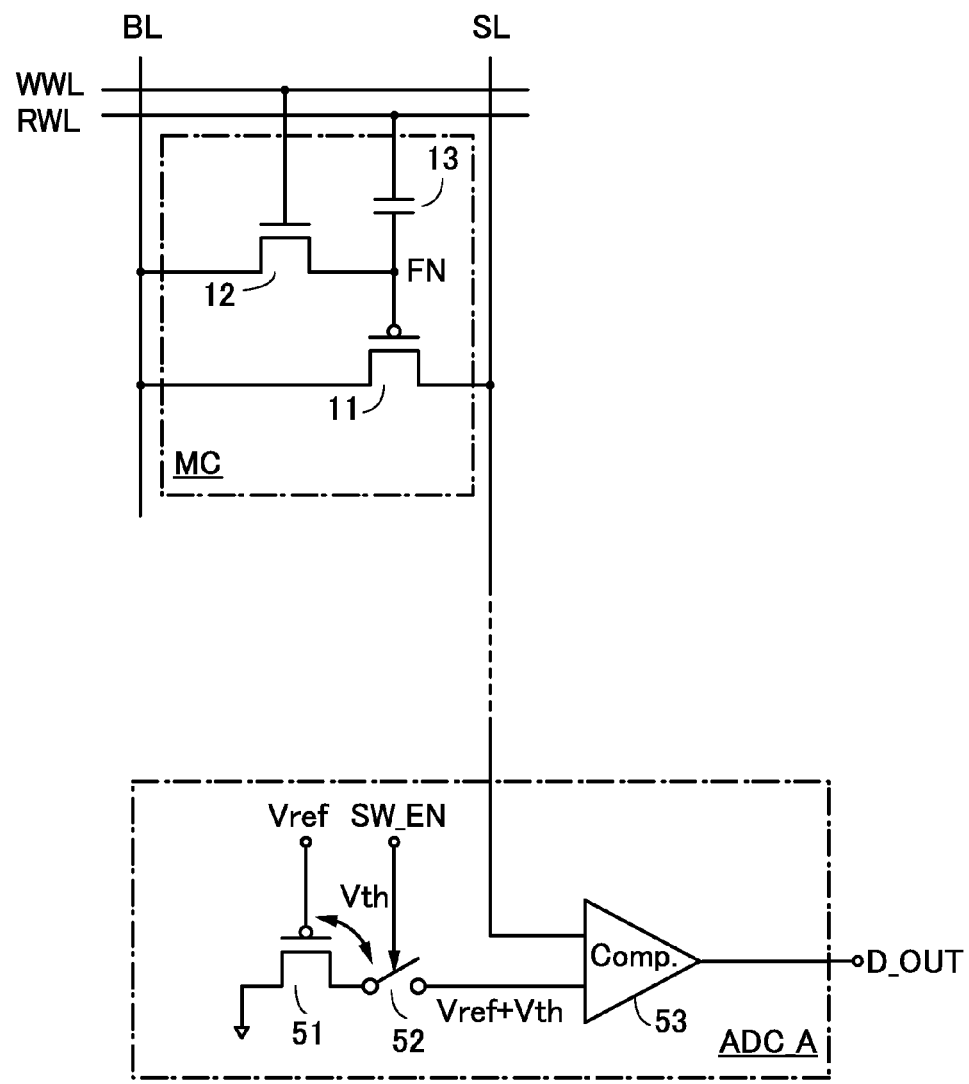
FIG. 9 is a circuit diagram illustrating one embodiment of the present invention.

Although the A/D converter ADC is connected to the wiring BL in the example of FIG. 1, it may employ another configuration, and for example, may be connected to the wiring SL. FIG. 9 illustrates an A/D converter ADC_A connected to the wiring SL. The operation of the A/D converter ADC_A for generating Vref+Vth is similar to that of the A/D converter ADC.

This configuration enables a voltage corresponding to data retained at the node FN to be read through the transistor 11. The voltage corresponding to data retained at the node FN is written to the node FN through the transistor 11, whereby the influence of the threshold voltage on the data to be read can be decreased. Thus, in the semiconductor device, the reliability of read data is excellent.

Figure 10:
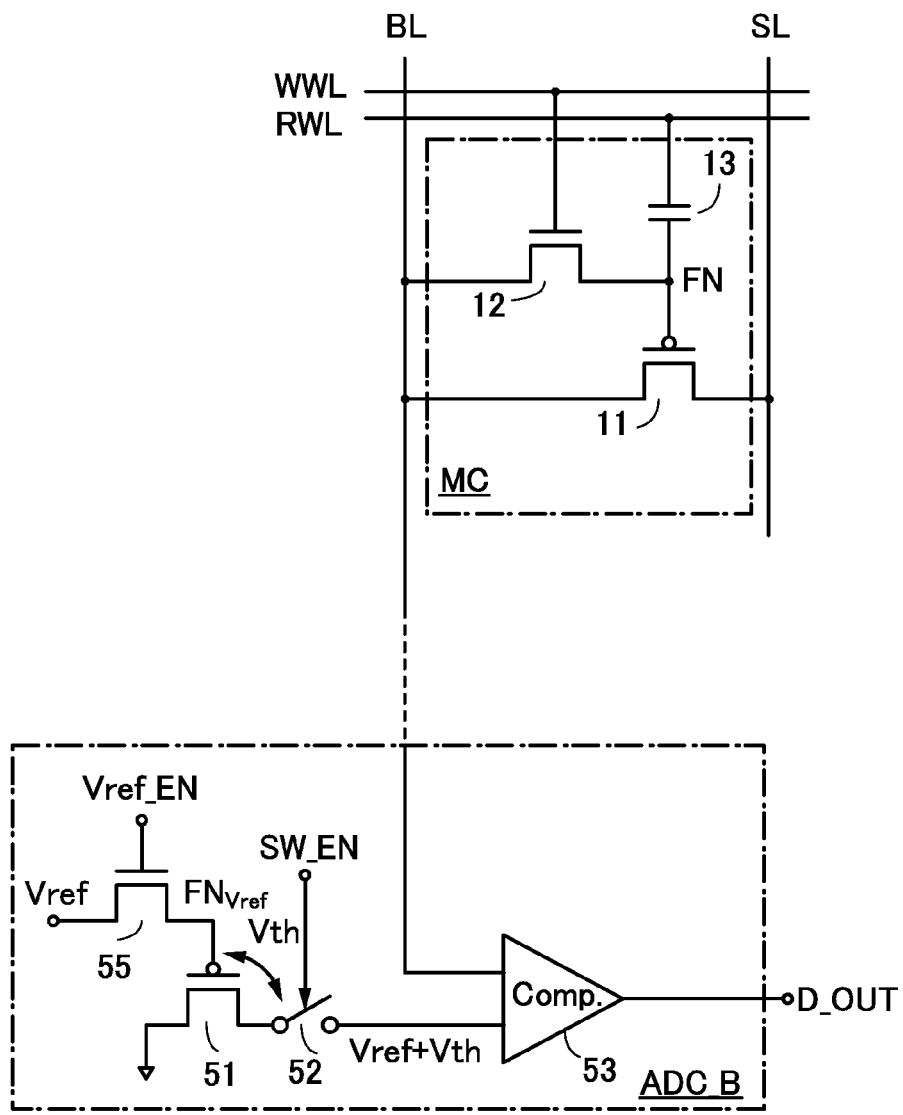
FIG. 10 is a circuit diagram illustrating one embodiment of the present invention.

Although the voltage Vref is directly applied to the gate of the transistor 51 in the A/D converter ADC of the example in FIG. 1, another configuration may be employed. For example, the voltage Vref may be applied to a node $FN_{Vref}$ through the transistor 55. FIG. 10 illustrates an A/D converter ADC_B in which the voltage Vref is not directly applied to the gate of the transistor 51. The operation of the A/D converter ADC_B for generating Vref+Vth is similar to that of the A/D converter ADC.

The transistor 55 is preferably a transistor with a low off-state current. For example, the transistor 55 is preferably an OS transistor like the transistor 12. The on/off state of the transistor 55 is controlled with a control signal Vref EN. Turning off the transistor 55 enables Vref applied to the node $FN_{Vref}$ to be retained. Thus, there is no need to apply the reference voltage Vref continuously from the outside, and power consumption can be reduced accordingly.

Figure 18A:
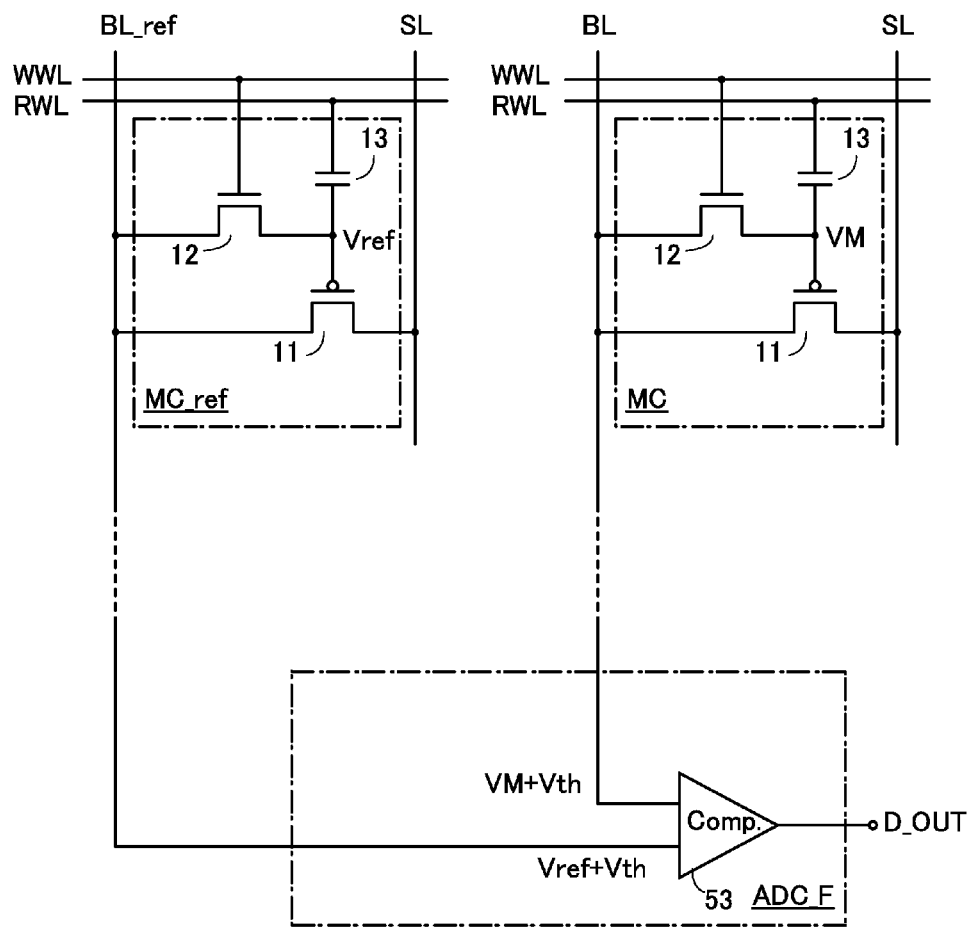
FIGS. 18A and 18B are a circuit diagram and a timing chart illustrating one embodiment of the present invention.

In the A/D converter ADC_B in FIG. 10, the configuration of the transistors 51 and 55 is the same as that of the transistors 11 and 12 included in the memory cell MC. Therefore, it may be possible to employ a structure where a circuit corresponding to the transistors 51 and 55 is provided in a memory cell array like the memory cell and a corrected reference voltage is read from the memory cell retaining the reference voltage Vref. FIG. 18A illustrates an example of a circuit diagram in this case.

The circuit diagram of FIG. 18A illustrates a memory cell MC_ref for retaining the reference voltage Vref and the memory cell MC for retaining the data voltage VM. A wiring BL_ref connected to the memory cell MC_ref and the wiring BL connected to memory cell MC are connected to the comparator 53 in an A/D converter ADC_F.

In data reading, a corrected reference voltage Vref+Vth is obtained from the wiring BL_ref, and a read voltage VM+Vth is obtained from the wiring BL. The corrected reference voltage Vref+Vth and the read voltage VM+Vth are generated in a manner similar to that in the description of FIG. 3B. Both the corrected reference voltage Vref+Vth and the read voltage VM+Vth are output as values each including the threshold voltage of the transistor 11. Accordingly, the read voltage can be subjected to A/D conversion after a variation in the corrected reference voltage due to the threshold voltage of the transistor 11 cancels out a variation in the read voltage due to the threshold voltage of the transistor 11. It is therefore possible to obtain a semiconductor device from which a read voltage affected by ambient temperatures or the like can be read as correct data.

Figure 18B:
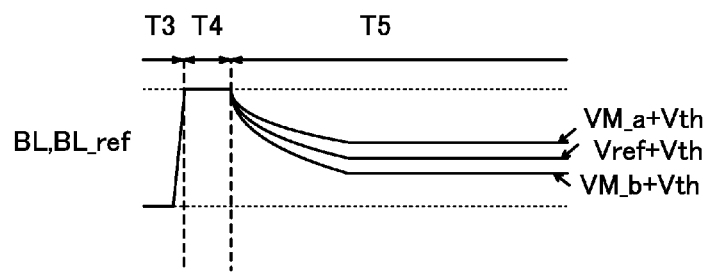

In the configuration of FIG. 18A, the read voltage and the corrected reference voltage are generated at the same timing. It is thus possible to precharge the wiring BL_ref and the wiring BL at the same timing and discharge these wirings through the transistors 11. Consequently, an output signal D_OUT based on the magnitude relation between the corrected reference voltage and the read voltage, like the corrected reference voltage Vref+Vth and the read voltage VM+Vth (shown as VM_a+Vth and VM_b+Vth) in a timing chart of FIG. 18B, is obtained immediately after the start of the discharge. Therefore, the semiconductor device can have high data reading speed.

Figure 11:
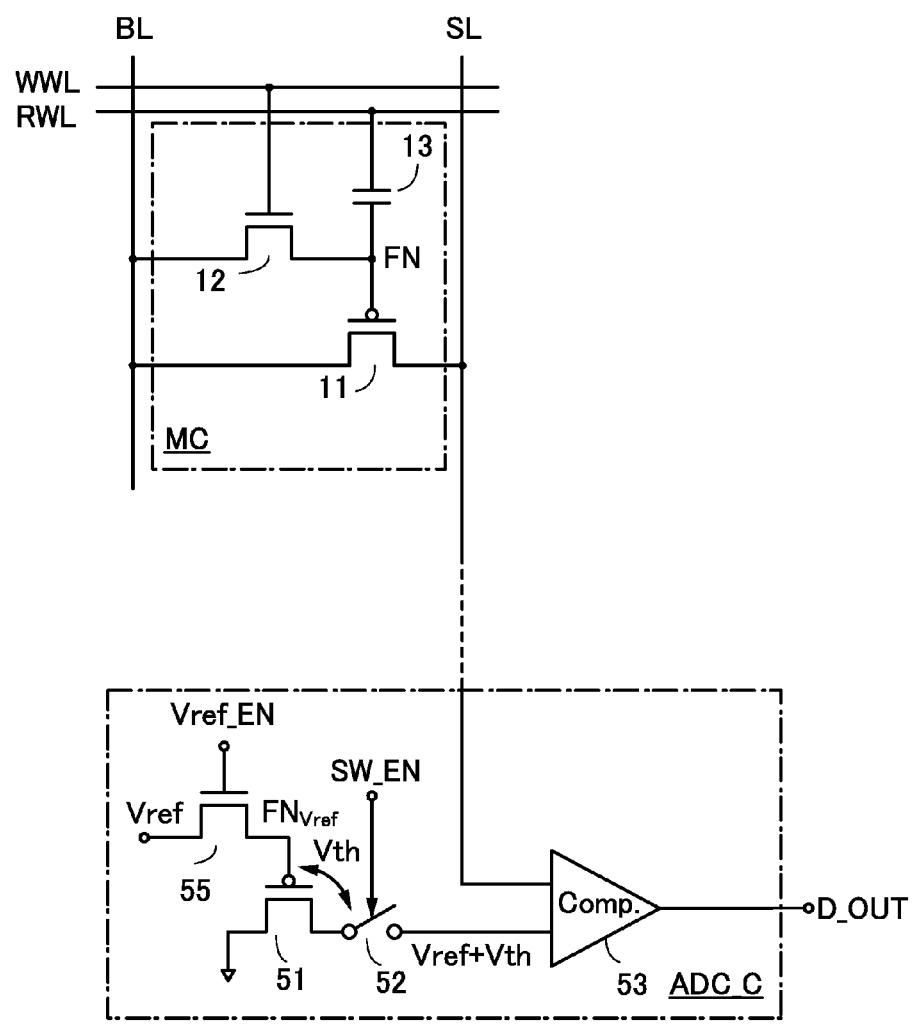
FIG. 11 is a circuit diagram illustrating one embodiment of the present invention.

Note that the A/D converter ADC_B in FIG. 10 may be connected to a source line as in the configuration of FIG. 9. FIG. 11 illustrates an A/D converter ADC_C connected to the wiring SL. The operation of the A/D converter ADC_C for generating Vref+Vth is similar to that of the A/D converter ADC.

With the above configurations, when data is read out, the influence of the threshold voltage on the read data can be decreased and power consumption can be reduced. Thus, in the semiconductor device, the read data can be highly reliable.

Figure 12A:
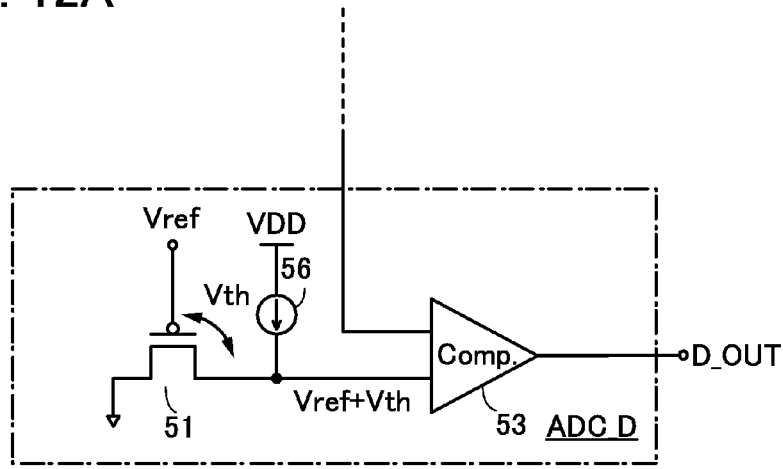
FIGS. 12A and 12B are circuit diagrams each illustrating one embodiment of the present invention.

In the example of FIG. 1, the A/D converter ADC generates Vref+Vth by turning on or off the switch 52; however, another configuration may be employed. For example, Vref+Vth may be generated using a source follower composed of a constant current source and the transistor 51. FIG. 12A illustrates an A/D converter ADC_D including a constant current source 56.

Figure 12B:
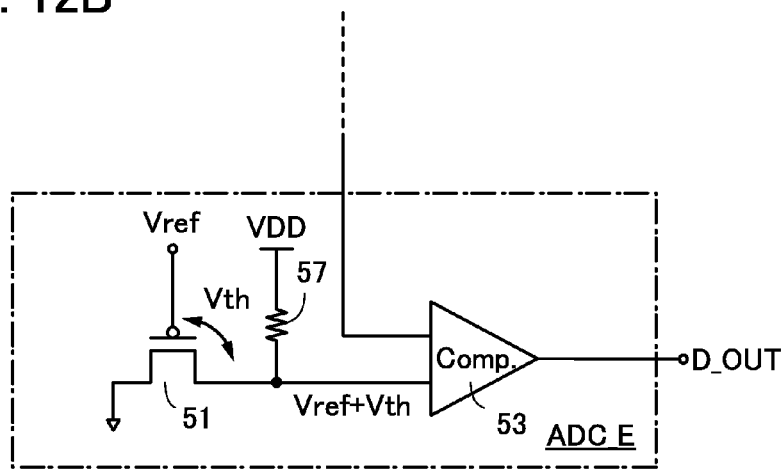

Note that a resistor may be used instead of the constant current source 56 in FIG. 12A. FIG. 12B illustrates an A/D converter ADC_E including a resistor 57.

As has been described, one embodiment of the present invention can operate using any of a variety of variation examples.

(Embodiment 3)

In this embodiment, the OS transistor shown in the above embodiment will be described.

<Off-State Current Characteristics>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$. In the oxide semiconductor, hydrogen, nitrogen, carbon, silicon, and metal elements other than main components are impurities. For example, hydrogen and nitrogen form donor levels to increase the carrier density.

A transistor using an intrinsic or substantially intrinsic oxide semiconductor has a low carrier density and thus is less likely to have negative threshold voltage. Moreover, because of few carrier traps in the oxide semiconductor, the transistor using the oxide semiconductor has small variation in electrical characteristics and high reliability. Furthermore, the transistor using the oxide semiconductor achieves an ultra-low off-state current.

Note that the OS transistor with a reduced off-state current can exhibit a normalized off-state current per micrometer in channel width of $1 \times 10^{-18}$ A or less, preferably $1 \times 10^{-21}$ A or less, further preferably $1 \times 10^{-24}$ A or less at room temperature (approximately 25° C.), or $1 \times 10^{-15}$ A or less, preferably $1 \times 10^{-18}$ A or less, further preferably $1 \times 10^{-21}$ A or less at 85° C.

<Off-State Current>

Unless otherwise specified, the off-state current in this specification refers to a drain current of a transistor in the off state (also referred to as non-conduction state and cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. For this reason, when there is Vgs at which the off-state current of a transistor is lower than or equal to I, it may be said that the off-state current of the transistor is lower than or equal to I. The off-state current of a transistor may refer to an off-state current at given Vgs, at Vgs in a given range, or at Vgs at which sufficiently low off-state current is obtained.

As an example, the assumption is made of an n-channel transistor where the threshold voltage Vth is 0.5 V and the drain current is $1 \times 10^{-9}$ A at Vgs of 0.5 V, $1 \times 10^{-13}$ A at Vgs of 0.1 V, $1 \times 10^{-19}$ A at Vgs of −0.5 V, and $1 \times 10^{-22}$ A at Vgs of −0.8 V. The drain current of the transistor is $1 \times 10^{-19}$ A or lower at Vgs of −0.5 V or at Vgs in the range of −0.8 V to −0.5 V; therefore, it can be said that the off-state current of the transistor is $1 \times 10^{-19}$ A or lower. Since there is Vgs at which the drain current of the transistor is $1 \times 10^{-22}$ A or lower, it may be said that the off-state current of the transistor is $1 \times 10^{-22}$ A or lower.

In this specification, the off-state current of a transistor with a channel width W is sometimes represented by a current value in relation to the channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., temperature in the range of 5° C. to 35° C.). When there is Vgs at which the off-state current of a transistor at room temperature, 60° C., 85° C., 95° C., 125° C., a temperature at which the reliability of a semiconductor device or the like including the transistor is ensured, or a temperature at which the semiconductor device or the like is used (e.g., temperature in the range of 5° C. to 35° C.) is lower than or equal to I, it may be said that the off-state current of the transistor is lower than or equal to I.

The off-state current of a transistor depends on voltage Vds between its drain and source in some cases. Unless otherwise specified, the off-state current in this specification may be an off-state current at Vds with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like. When there is Vgs at which the off-state current of a transistor is lower than or equal to I at given Vds, it may be said that the off-state current of the transistor is lower than or equal to I. Here, given Vds is, for example, 0.1 V, 0.8 V, 1 V, 1.2 V, 1.8 V, 2.5 V, 3 V, 3.3 V, 10 V, 12 V, 16 V, 20 V, Vds at which the reliability of a semiconductor device or the like including the transistor is ensured, or Vds used in the semiconductor device or the like.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

An oxide semiconductor used for a semiconductor layer of an OS transistor preferably contains at least indium (In) or zinc (Zn). In particular, the oxide semiconductor preferably contains In and Zn. A stabilizer for strongly bonding with oxygen is preferably contained in addition to In and Zn. As a stabilizer, at least one of gallium (Ga), tin (Sn), zirconium (Zr), hafnium (Hf), and aluminum (Al) is contained.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, it is possible to use an In—Ga—Zn-based oxide with an atomic ratio of In:Ga:Zn=1:1:1, 3:1:2, 4:2:3, or 2:1:3 or close thereto.

<Impurities in Oxide Semiconductor>

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferred that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is conceivably reduced by the dehydration treatment (dehydrogenation treatment). For this reason, it is preferred that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by oxygen adding treatment, whereby the oxide semiconductor film can be transformed to an i-type (intrinsic) oxide semiconductor film or a substantially i-type (intrinsic) oxide semiconductor film that is extremely close to an i-type oxide semiconductor film. The term "substantially intrinsic" means that the oxide semiconductor film contains extremely few (close to zero) carriers derived from a donor and has a carrier density of lower than $8\times10^{11}/cm^3$, preferably lower than $1\times10^{11}/cm^3$, further preferably lower than $1\times10^{10}/cm^3$ and higher than or equal to $1\times10^{-9}/cm^3$.

<Structure of Oxide Semiconductor>

Next, a structure of an oxide semiconductor will be described.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis-aligned crystalline oxide semiconductor (CAAC-OS), a polycrystalline oxide semiconductor, a microcrystalline oxide semiconductor, and an amorphous oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is an oxide semiconductor film having a plurality of c-axis-aligned crystal parts.

When a combined analysis image (also referred to as high-resolution TEM image) of a bright-field image and a diffraction pattern of the CAAC-OS film is observed with a transmission electron microscope (TEM), a plurality of crystal parts are observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

When a CAAC-OS film, e.g., a CAAC-OS film including an InGaZnO$_4$ crystal, is subjected to structural analysis by an out-of-plane method with an X-ray diffraction (XRD) apparatus, a peak appears frequently at a diffraction angle (2θ) of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in the CAAC-OS film. It is preferred that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. An element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. The impurity contained in the oxide semiconductor film may serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Consequently, a transistor including such an oxide semiconductor film rarely has negative threshold voltage (rarely has normally-on characteristics). The highly purified intrinsic or substantially highly purified intrinsic oxide semiconductor film has few carrier traps; therefore, the transistor including the oxide semiconductor film has little variation in electrical characteristics and high reliability. Charge trapped by the carrier traps in the oxide semiconductor film requires a long time to be released and might behave like fixed charge. Thus, the transistor including an oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In a high-resolution TEM image of the microcrystalline oxide semiconductor film, there are a region where a crystal part is observed and a region where a crystal part is not clearly observed. In most cases, a crystal part in the microcrystalline oxide semiconductor film ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. For example, in a high-resolution TEM image of the nc-OS film, a grain boundary is not clearly observed in some cases.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film; thus, the orientation of the whole film is not observed. Consequently, the nc-OS film cannot be distinguished from an amorphous oxide semiconductor film by some analysis methods. For example, when the nc-OS film is subjected to structural analysis by an out-of-plane method with an XRD apparatus using an X-ray having a diameter larger than the size of a crystal part, a peak showing a crystal plane does not appear. A diffraction pattern like a halo pattern appears in a selected-area electron diffraction pattern of the nc-OS film obtained by using an electron beam having a probe diameter larger than the size of a crystal part (e.g., having a probe diameter of 50 nm or larger). Meanwhile, spots are observed in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown or a plurality of spots is shown in a ring-like region in some cases.

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. An example of the amorphous oxide semiconductor film is an oxide semiconductor film with a non-crystalline state like quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but any spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void is sometimes observed. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found in some cases. In contrast, crystallization is scarcely observed in the nc-OS film having good quality when the electron-beam irradiation is carried out at a low intensity as in the TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, focusing on the lattice fringes in the high-resolution TEM image, each of the lattice fringes having a distance therebetween of 0.28 nm to 0.30 nm corresponds to the a-b plane of the InGaZnO$_4$ crystal.

The density of an oxide semiconductor film varies with its structure in some cases. For example, when the composition of an oxide semiconductor film becomes clear, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in an oxide semiconductor film with an atomic ratio of In:Ga:Zn=1:1:1, the density of single crystal InGaZnO$_4$ with a rhombohedral crystal structure is 6.357 g/cm$^3$. Thus, for example, the density of an a-like OS film with an atomic ratio of In:Ga:Zn=1:1:1 is higher than or equal to 5.0 g/cm$^3$ and lower than 5.9 g/cm$^3$. Moreover, for example, the density of an nc-OS film or a CAAC-OS film with an atomic ratio of In:Ga:Zn=1:1:1 is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate a density that corresponds to the density of a single crystal with a desired composition. The density of the single crystal with a desired composition can be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

As described above, the OS transistor can achieve extremely favorable off-state current characteristics.

(Embodiment 4)

In this embodiment, examples of a layout diagram of the memory cell MC, a circuit diagram and a schematic cross-sectional view that correspond to the layout diagram, and a schematic view showing layouts of layers will be described with reference to FIGS. 13A and 13B, FIG. 14, and FIG. 15.

Figure 13A:
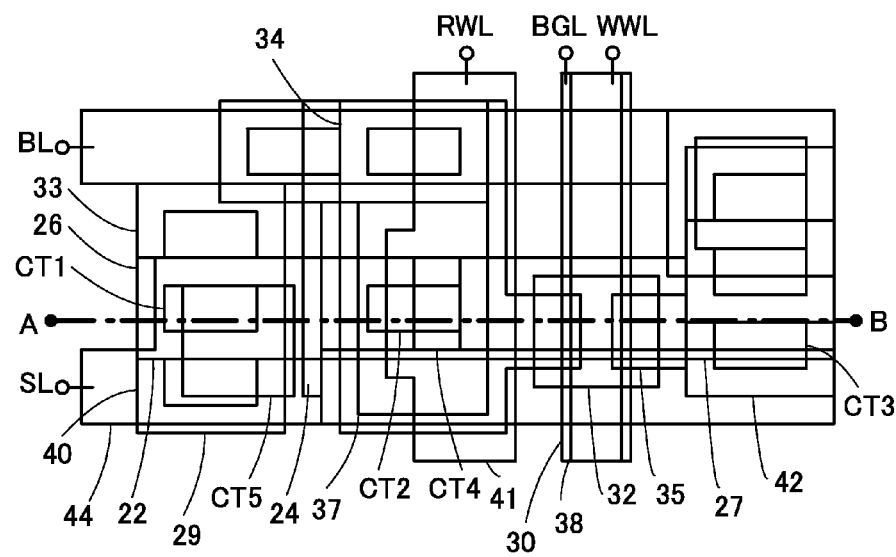
FIGS. 13A and 13B are a top view and a circuit diagram illustrating one embodiment of the present invention.
Figure 13B:
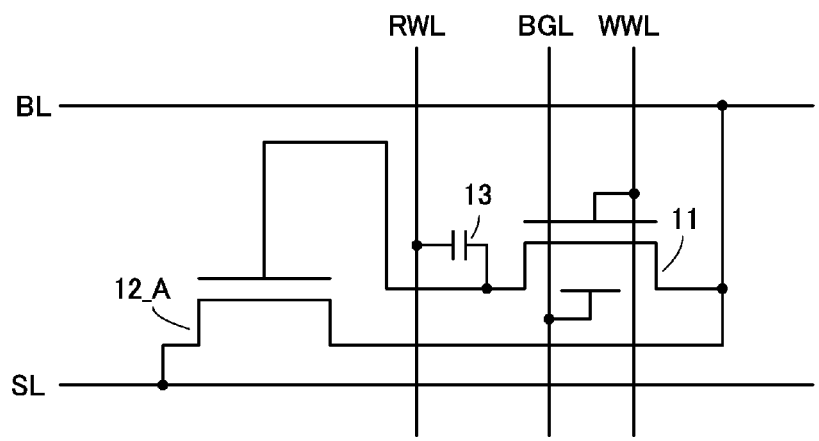
Figure 14:
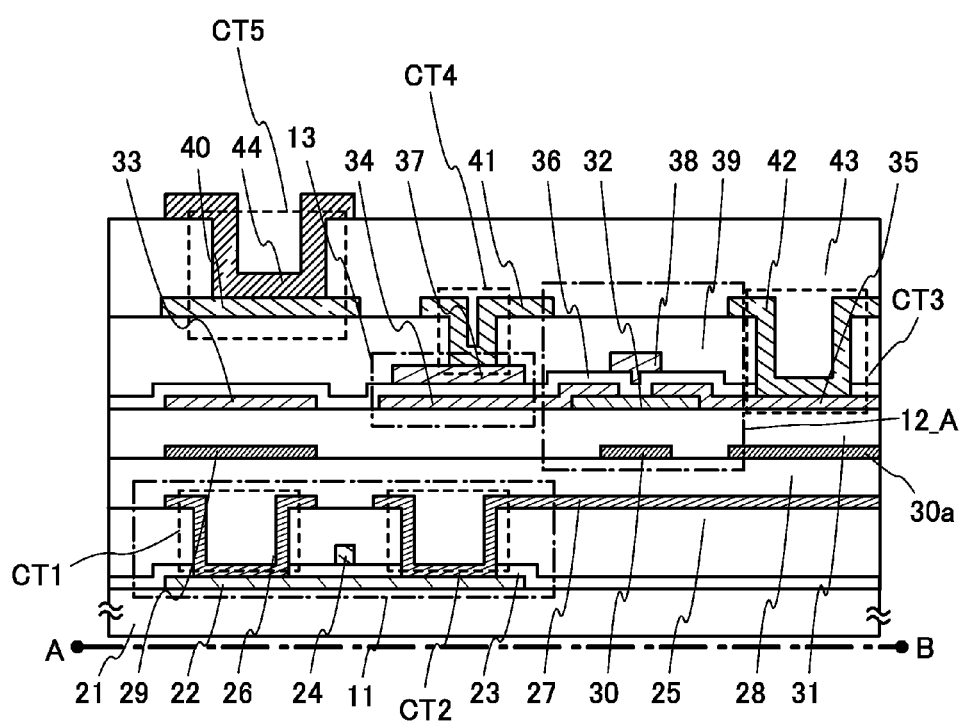
FIG. 14 is a schematic cross-sectional view illustrating one embodiment of the present invention.

FIG. 13A is a layout diagram of the memory cell MC. FIG. 13B is a circuit diagram corresponding to the layout diagram of FIG. 13A. The circuit diagram of FIG. 13B corresponds to that of FIG. 8B. FIG. 14 is a schematic cross-sectional view along dashed-dotted line A-B in FIG. 13A. FIG. 15 is a schematic view illustrating the layer layout corresponding to the schematic cross-sectional view of FIG. 14.

FIG. 13A and FIG. 14 illustrate a substrate 21, a semiconductor layer 22, an insulating layer 23, a conductive layer 24, an insulating layer 25, a conductive layer 26, a conductive layer 27, an insulating layer 28, a conductive layer 29, a conductive layer 30, a conductive layer 30a, an insulating layer 31, a semiconductor layer 32, a conductive layer 33, a conductive layer 34, a conductive layer 35, an insulating layer 36, a conductive layer 37, a conductive layer 38, an insulating layer 39, a conductive layer 40, a conductive layer 41, a conductive layer 42, an insulating layer 43, a conductive layer 44, and openings CT1 to CT5.

The substrate 21 can be, for example, a single crystal silicon substrate (including a p-type semiconductor substrate or an n-type semiconductor substrate), a compound semiconductor substrate containing silicon carbide or gallium nitride, a silicon on insulator (SOI) substrate, or a glass substrate.

An amorphous semiconductor, a microcrystalline semiconductor, a polycrystalline semiconductor, or the like can be used for the semiconductor layers 22 and 32. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In particular, the semiconductor layer 32 is preferably a single layer or a stacked layer formed using an oxide semiconductor. The oxide semiconductor here refers to an oxide containing at least indium, gallium, and zinc and can be an In—Ga—Zn-based oxide (IGZO). Note that the In—Ga—Zn-based oxide refers to an oxide containing In, Ga, and Zn and may contain a metal element other than In, Ga, and Zn. For example, it is possible to use an In—Sn—Ga—Zn-based oxide, an In—Hf—Ga—Zn-based oxide, or an In—Al—Ga—Zn-based oxide. The oxide semiconductor can be formed by a sputtering method, an atomic layer deposition (ALD) method, an evaporation method, a coating method, or the like.

A metal material such as aluminum, copper, titanium, tantalum, or tungsten is preferably used for each of the conductive layers 24, 26, 27, 29, 30, 30a, 33, 34, 35, 37, 38, 40, 41, 42, and 44. Alternatively, polycrystalline silicon to which an impurity such as phosphorus is added can be used. As the formation method, a variety of film formation methods such as an evaporation method, a plasma-enhanced chemical vapor deposition (PECVD) method, a sputtering method, and a spin coating method can be used.

Each of the insulating layers 23, 25, 28, 31, 36, 39, and 43 is preferably a single layer or a multilayer including an inorganic insulating layer or an organic insulating layer. The inorganic insulating layer is preferably a single layer or a multilayer formed using a silicon nitride film, a silicon oxynitride film, a silicon nitride oxide film, or the like. The organic insulating layer is preferably a single layer or a multilayer formed using a polyimide, an acrylic resin, or the like. There is no particular limitation on a method for forming each of the insulating layers; for example, a sputtering method, a molecular beam epitaxy (MBE) method, a PECVD method, a pulse laser deposition method, or an ALD method can be employed as appropriate.

When an oxide semiconductor is used for the semiconductor layer 32, each of the insulating layers 31 and 36 in contact with the semiconductor layer 32 is preferably a single or multilayer inorganic insulating layer. More preferably, the insulating layers 31 and 36 have an effect of supplying oxygen to the semiconductor layer 32.

The openings CT1 and CT2 are provided in the insulating layers 23 and 25 in order to connect the conductive layers 26 and 27 to the semiconductor layer 22 directly. The opening CT3 is provided in the insulating layers 36 and 39 in order to connect the conductive layer 35 and the conductive layer 42 directly. The opening CT4 is provided in the insulating layer 39 in order to connect the conductive layer 37 and the conductive layer 41 directly. The opening CT5 is provided in the insulating layer 43 in order to connect the conductive layer 40 and the conductive layer 44 directly.

FIG. 15 separately illustrates the conductive layers and the semiconductor layers in the layout diagram of the memory cell MC in FIG. 13A and the schematic cross-sectional view along dashed-dotted line A-B in FIG. 13A. FIG. 15 also shows the openings for connecting conductive layers to each other and for connecting the conductive layer and the semiconductor layer.

In FIG. 15, a layout of the semiconductor layer 22 and a semiconductor layer formed at the same level is denoted by "Si layer"; a layout of the conductive layer 24 and a conductive layer formed at the same level, by "Si GE layer"; a layout of the conductive layers 26 and 27 and a conductive layer formed at the same level, by "Si S/D layer"; a layout of the conductive layers 29, 30, and 30a and a conductive layer formed at the same level, by "OS BG layer"; a layout of the semiconductor layer 32 and a semiconductor layer formed at the same level, by "OS layer"; a layout of the conductive layers 33, 34, and 35 and a conductive layer formed at the same level, by "OS S/D layer"; a layout of the conductive layers 37 and 38 and a conductive layer formed at the same level, by "OS GE layer"; a layout of the conductive layers 40, 41, and 42 and a conductive layer formed at the same level, by "1st conductive layer"; and a layout of the conductive layer 44 and a conductive layer formed at the same level, by "2nd conductive layer."

As shown in the layout diagram of FIG. 13A, the conductive layers 34 and 35 in contact with the semiconductor layer 32 are preferably provided not to completely cover edges of the semiconductor layer 32 that are parallel to the channel width direction. This structure reduces the area where the conductive layers 34 and 35 overlap with the conductive layers 30 and 38, thereby reducing parasitic capacitance between the conductive layers. Thus, it is possible to suppress a change in potential of the conductive layers 34 and 35 due to a change in potential of the conductive layers 30 and 38.

(Embodiment 5)

Although the conductive layer and the semiconductor layer described in the above embodiments can be formed by a sputtering method, they may be formed by another method, for example, a thermal CVD method. Examples of a thermal CVD method include a metal organic chemical vapor deposition (MOCVD) method and an ALD method.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and the source gas and the oxidizer are reacted with each other in the vicinity of a substrate or over the substrate.

In an ALD method, deposition is performed in such a manner that the pressure in a chamber is set to an atmospheric pressure or a reduced pressure, source gases for reaction are sequentially introduced into the chamber and reacted, and then the sequence of the gas introduction is repeated. An inert gas (e.g., argon or nitrogen) may be introduced as a carrier gas with the source gases. Two or more kinds of source gases may be sequentially supplied to the chamber. In this case, after the reaction of a first source gas, an inert gas is introduced, and then a second source gas is introduced so that the source gases are not mixed. Alternatively, the second source gas may be introduced after the first source gas is exhausted by vacuum evacuation instead of the introduction of the inert gas. The first source gas is adsorbed on the surface of a substrate and reacted to form a first layer, and then, the second source gas introduced thereafter is absorbed and reacted; as a result, a second layer is stacked over the first layer and thus, a thin film is formed. The sequence of the gas introduction is repeated multiple times until a desired thickness is obtained, whereby a thin film with excellent step coverage can be formed. The thickness of the thin film can be adjusted by the number of repetitions of the gas introduction; therefore, an ALD method makes it possible to accurately adjust a thickness and thus is suitable for manufacturing a minute FET.

The conductive film and the semiconductor film described in the above embodiments can be formed by a thermal CVD method such as an MOCVD method or an ALD method. For example, trimethylindium ($In(CH_3)_3$), trimethylgallium ($Ga(CH_3)_3$), and dimethylzinc ($Zn(CH_3)_2$) are used to form an In—Ga—Zn—O film. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, when a tungsten film is formed using a deposition apparatus employing ALD, a $WF_6$ gas and a $B_2H_6$ gas are sequentially introduced to form an initial tungsten film, a $WF_6$ gas and an $H_2$ gas are sequentially introduced, and the latter process is repeated so that a tungsten film is formed. Note that a $SiH_4$ gas may be used instead of a $B_2H_6$ gas.

For example, when an oxide semiconductor film, e.g., an In—Ga—Zn—O film is formed using a deposition apparatus employing ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed oxide layer such as an In—Ga—O layer, an In—Zn—O layer, or a Ga—Zn—O layer may be formed by mixing of these gases. Although an $H_2O$ gas obtained by bubbling with an inert gas such as Ar may be used instead of an $O_3$ gas, it is preferable to use an $O_3$ gas, which does not contain H.

(Embodiment 6)

In this embodiment, application examples of the semiconductor device described in the foregoing embodiments to an electronic component and to an electronic device including the electronic component will be described with reference to FIGS. 16A and 16B and FIGS. 17A to 17E.

Figure 16A:
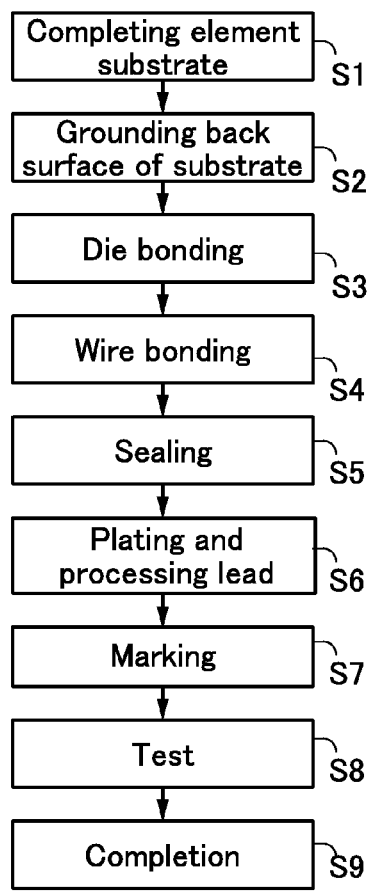
FIGS. 16A and 16B are a flowchart and a perspective view illustrating one embodiment of the present invention.

FIG. 16A shows an example where the semiconductor device described in the foregoing embodiment is used to prepare an electronic component. Note that an electronic component is also referred to as semiconductor package or IC package. For the electronic component, there are various standards and names corresponding to the direction or the shape of terminals; hence, one example of the electronic component will be described in this embodiment.

A semiconductor device including transistors as illustrated in FIGS. 13A and 13B, FIG. 14, and FIG. 15 of Embodiment 4 is completed by integrating detachable components on a printed circuit board through the assembly process (post-process).

The post-process can be completed through steps shown in FIG. 16A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, resin bonding, tape-automated bonding, or the like is selected as determined as appropriate by products. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

Since the electronic component described above includes the semiconductor device described in the foregoing embodiment, it is possible to obtain a highly reliable electronic component.

Figure 16B:
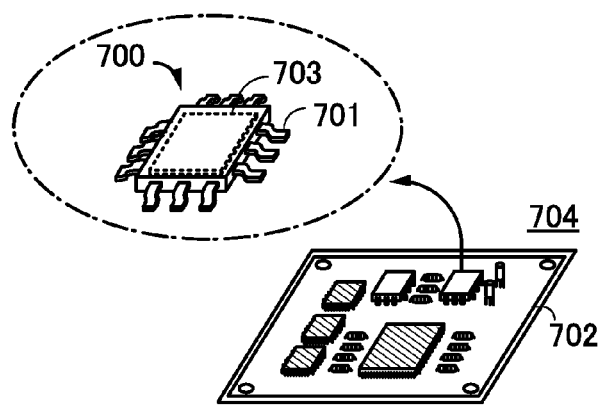

FIG. 16B is a schematic perspective view of a completed electronic component. FIG. 16B shows a schematic perspective view of a quad flat package (QFP) as an example of the electronic component. An electronic component 700 illustrated in FIG. 16B includes a lead 701 and a circuit portion 703. The electronic component 700 in FIG. 16B is mounted on a printed circuit board 702, for example. A combination of electronic components 700 electrically connected to each other over the printed circuit board 702 can be equipped in an electronic device. A completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 17A:
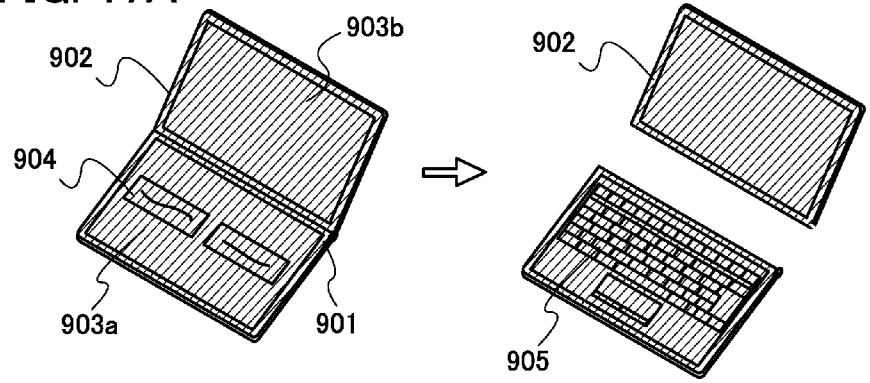
FIGS. 17A to 17E each illustrate an electronic device to which one embodiment of the present invention can be applied.

FIG. 17A illustrates a portable information appliance that includes a housing 901, a housing 902, a first display portion 903a, a second display portion 903b, and the like. At least one of the housings 901 and 902 is provided with the semiconductor device of the foregoing embodiment. It is thus possible to obtain a highly reliable portable information appliance.

Note that the first display portion 903a is a panel having a touch input function, and for example, as illustrated in the left of FIG. 17A, operation via "touch input" or "keyboard input" can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 17A. Thus, letters can be input quickly by key input as in a conventional information appliance, for example.

One of the first display portion 903a and the second display portion 903b can be detached from the portable information appliance as shown in the right of FIG. 17A. Providing the second display portion 903b with a touch input function makes the information appliance convenient to carry because a weight to carry around can be further reduced and the information appliance can operate with one hand while the other hand supports the housing 902.

The portable information appliance in FIG. 17A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 17A may be configured to transmit and receive data wirelessly. Through wireless communication, desired book data or the like can be purchased and downloaded from an e-book server.

In addition, the housing 902 illustrated in FIG. 17A may be equipped with an antenna, a microphone function, and a wireless communication function to be used as a mobile phone.

Figure 17B:
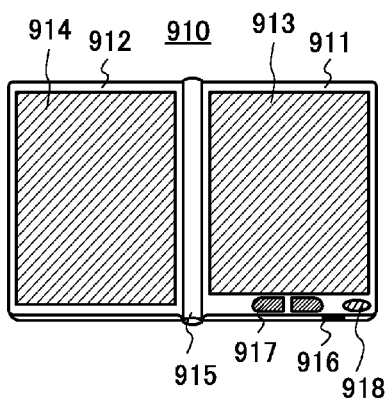

FIG. 17B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The semiconductor device of the foregoing embodiment is provided in at least one of the housings 911 and 912. It is thus possible to obtain a highly reliable e-book reader.

Figure 17C:
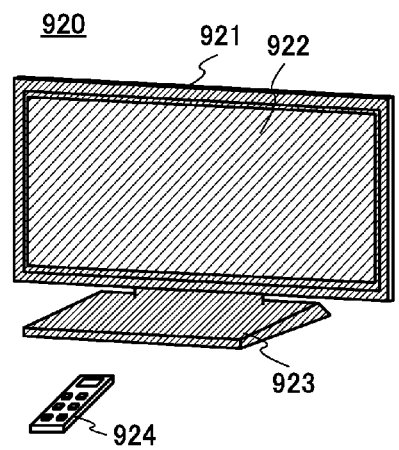

FIG. 17C illustrates a television device 920 including a housing 921, a display portion 922, a stand 923, and the like. The television device 920 can be controlled by a switch of the housing 921 and a separate remote controller 924. The semiconductor device of the foregoing embodiment is provided in the housing 921 and the remote controller 924. Consequently, it is possible to obtain a highly reliable television device.

Figure 17D:
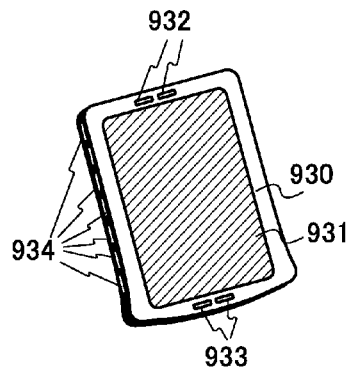

FIG. 17D illustrates a smartphone in which a main body 930 is provided with a display portion 931, a speaker 932, a microphone 933, operation buttons 934, and the like. The semiconductor device of the foregoing embodiment is provided in the main body 930. It is thus possible to obtain a highly reliable smartphone.

Figure 17E:
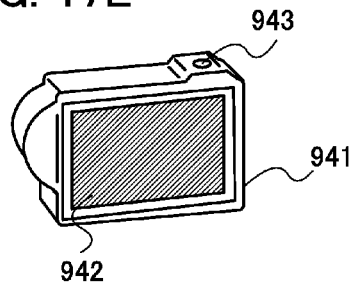

FIG. 17E illustrates a digital camera including a main body 941, a display portion 942, an operation switch 943, and the like. The semiconductor device of the foregoing embodiment is provided in the main body 941. Thus, it is possible to obtain a highly reliable digital camera.

As described above, the electronic device shown in this embodiment includes the semiconductor device of the foregoing embodiment, thereby having high reliability.

(Supplementary Notes on Description in this Specification and the Like)

The following are notes on the description of Embodiments 1 to 6 and the structures in Embodiments 1 to 6.

<Notes on One Embodiment of the Present Invention Described in Embodiments>

One embodiment of the present invention can be constituted by appropriately combining the structure described in an embodiment with any of the structures described the other embodiments. In addition, in the case where a plurality of structure examples are described in one embodiment, any of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with a text in this specification.

By combining a diagram (or part thereof) described in one embodiment with another part of the diagram, a different diagram (or part thereof) described in the embodiment, and/or a diagram (or part thereof) described in another embodiment or other embodiments, much more diagrams can be created.

One embodiment of the present invention is not limited to those described in Embodiments 1 to 6. For example, in Embodiment 1, a structure using an OS transistor as a transistor with a low off-state current is described as one embodiment of the present invention; however, one embodiment of the present invention is not limited to using an OS transistor as long as a transistor with a low off-state current is used. Accordingly, for example, a structure without an OS transistor may be one embodiment of the present invention under some circumstances.

<Notes on Description for Drawings>

In this specification and the like, terms for describing arrangement, such as "over" and "under", are used for convenience to indicate a positional relation between components with reference to drawings. The positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on situations.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as plan view or layout view) and a perspective view, some of components might not be illustrated for clarity of the drawings.

<Notes on Expressions that can be Rephrased>

In this specification and the like, in describing the connection relation of a transistor, one of a source and a drain is referred to as "one of a source and a drain" (or a first electrode or a first terminal), and the other of the source and the drain is referred to as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of electrodes or wirings formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

<Notes on Definitions of Terms>

The following are definitions of the terms mentioned in the above embodiments.

<<Switch>>

In this specification and the like, a switch is conducting or not conducting (is turned on or off) to determine whether current flows therethrough or not. Alternatively, a switch has a function of selecting and changing a current path.

For example, an electrical switch or a mechanical switch can be used. That is, any element can be used as a switch as long as it can control current, without limitation to a certain element.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS)

diode, and a diode-connected transistor), and a logic circuit in which such elements are combined.

In the case of using a transistor as a switch, the "on state" of the transistor refers to a state in which a source and a drain of the transistor are regarded as being electrically short-circuited. Furthermore, the "off state" of the transistor refers to a state in which the source and the drain of the transistor are regarded as being electrically disconnected. In the case where a transistor operates just as a switch, there is no particular limitation on the polarity (conductivity type) of the transistor.

An example of a mechanical switch is a switch formed using a microelectromechanical system (MEMS) technology, such as a digital micromirror device (DMD). Such a switch includes an electrode that can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a top view of the transistor.

In one transistor, channel lengths in all regions are not necessarily the same. That is, the channel length of one transistor is not limited to one value in some cases. Therefore, in this specification, the channel length is any one of lengths, the maximum length, the minimum length, or the average length in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed.

In one transistor, channel widths in all regions are not necessarily the same. That is, the channel width of one transistor is not fixed to one value in some cases. Therefore, in this specification, a channel width is any one of widths, the maximum width, the minimum width, or the average width in a region where a channel is formed.

Note that in some transistor structures, a channel width in a region where a channel is actually formed (hereinafter referred to as effective channel width) is different from a channel width shown in a top view of a transistor (hereinafter referred to as apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is sometimes high. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

In view of this, in a top view of a transistor in this specification, an apparent channel width that is the length of a portion where a source and a drain face each other in a region where a semiconductor and a gate electrode overlap with each other is referred to as a surrounded channel width (SCW) in some cases. Furthermore, in this specification, the term "channel width" may denote a surrounded channel width, i.e., an apparent channel width or an effective channel width. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one when an effective channel width is used for the calculation is obtained in some cases.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

This application is based on Japanese Patent Application serial No. 2014-236427 filed with Japan Patent Office on Nov. 21, 2014, the entire contents of which are hereby incorporated by reference.

What is claimed is:

1. A semiconductor device comprising:
   a memory cell comprising a first transistor; and
   an A/D converter comprising a second transistor and a comparator,
   wherein a first input terminal of the comparator is electrically connected to one of a source and a drain of the first transistor, and a second input terminal of the comparator is electrically connected to one of a source and a drain of the second transistor,
   wherein the second input terminal of the comparator is configured such that charge of the second input terminal of the comparator is released through the second transistor after the second input terminal of the comparator is precharged,
   wherein the memory cell is configured to retain a plurality of voltages and to output a first voltage that is a sum of one of the plurality of voltages and a threshold voltage of the first transistor,
   wherein the comparator is configured to compare the first voltage output from the memory cell and a second voltage output from the one of the source and the drain of the second transistor,
   wherein the second voltage is a sum of a reference voltage supplied to a gate of the second transistor and a threshold voltage of the second transistor, and
   wherein an output terminal of the comparator is not directly connected to the gate of the second transistor.

2. The semiconductor device according to claim 1, wherein the first voltage is a voltage read out from the memory cell when a current flows through the first transistor according to one of the plurality of voltages.

3. The semiconductor device according to claim 1, wherein each of the first and second transistors comprises silicon in a channel formation region.

4. The semiconductor device according to claim 1, wherein the threshold voltages of the first transistor and the second transistor are substantially the same.

5. The semiconductor device according to claim 1, further comprising:
   a wiring provided between the second transistor to the comparator, the wiring configured to be supplied with the second voltage; and
   a switch provided between the second transistor and the wiring.

6. The semiconductor device according to claim 5, wherein the second voltage is obtained by precharging the wiring, turning on the switch, and then discharging the wiring.

7. The semiconductor device according to claim 1, wherein the memory cell further comprises a third transistor,
   wherein one of a source and a drain of the third transistor is electrically connected to a gate of the first transistor, and
   wherein the third transistor comprises an oxide semiconductor in a channel formation region.

8. The semiconductor device according to claim 1, wherein the A/D converter is a flash A/D converter.

9. An electronic device comprising:
   the semiconductor device according to claim 1; and
   a display portion.

10. A semiconductor device comprising:
    a memory cell comprising a first transistor;
    an A/D converter comprising a second transistor and a comparator;
    a first wiring electrically connected to one of a source and a drain of the first transistor and a first input terminal of the comparator, wherein the first wiring is configured to supply a first voltage from the memory cell to the comparator;
    a second wiring electrically connected to a gate of the second transistor, wherein the second wiring is configured to supply a reference voltage to the gate of the second transistor, wherein the second wiring is not directly connected to an output terminal of the comparator; and
    a third wiring electrically connected to one of a source and a drain of the second transistor and a second input terminal of the comparator, wherein the third wiring is configured such that charge of the third wiring is released through the second transistor after the third wiring is precharged, and a potential of the third wiring is a second voltage.

11. The semiconductor device according to claim 10, wherein the first voltage is a sum of one of a plurality of voltages stored in the memory cell and a threshold voltage of the first transistor.

12. The semiconductor device according to claim 10, wherein the second voltage is a sum of the reference voltage and a threshold voltage of the second transistor.

13. The semiconductor device according to claim 10, wherein each of the first and second transistors comprises silicon in a channel formation region.

14. The semiconductor device according to claim 10, further comprising a switch provided between the second transistor and the third wiring.

15. The semiconductor device according to claim 10,
wherein the memory cell further comprises a third transistor,
wherein one of a source and a drain of the third transistor is electrically connected to a gate of the first transistor, and
wherein the third transistor comprises an oxide semiconductor in a channel formation region.

16. The semiconductor device according to claim 10, wherein the A/D converter is a flash A/D converter.

17. An electronic device comprising:
the semiconductor device according to claim 10; and
a display portion.

18. The semiconductor device according to claim 10, wherein the threshold voltages of the first transistor and the second transistor are substantially the same.

\* \* \* \* \*